United States Patent
Lee et al.

(10) Patent No.: US 11,476,287 B2
(45) Date of Patent: Oct. 18, 2022

(54) IMAGE SENSOR WITH LIGHT BLOCKING LAYER

(71) Applicant: SAMSUNG ELECTRONICS CO., LTD., Suwon-si (KR)

(72) Inventors: Gwi Deok Ryan Lee, Hwaseong-si (KR); Jae Kyu Lee, Seongnam-si (KR); Sang Chun Park, Seoul (KR); Tae Yon Lee, Seoul (KR); Jae Hoon Jeon, Hwaseong-si (KR); Myung Lae Chu, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 176 days.

(21) Appl. No.: 16/928,263

(22) Filed: Jul. 14, 2020

(65) Prior Publication Data

US 2021/0118927 A1    Apr. 22, 2021

(30) Foreign Application Priority Data

Oct. 21, 2019 (KR) .................. 10-2019-0130339

(51) Int. Cl.
*H01L 27/146* (2006.01)
*H01L 21/00* (2006.01)
(Continued)

(52) U.S. Cl.
CPC .. *H01L 27/14614* (2013.01); *H01L 27/14623* (2013.01); *H01L 27/14636* (2013.01);
(Continued)

(58) Field of Classification Search
CPC .................. H01L 27/14623; H01L 27/14665
(Continued)

(56) References Cited

U.S. PATENT DOCUMENTS 7,268,369 B2 * 9/2007 Araki .............. H01L 31/022408
                                                          438/210
8,455,971 B2    6/2013 Chen et al.
(Continued)

FOREIGN PATENT DOCUMENTS

JP    2011-119950    6/2016

OTHER PUBLICATIONS

European Search Report dated Mar. 12, 2021 in corresponding European Application No. 20202908.8 (6 pages).

*Primary Examiner* — Calvin Lee
(74) *Attorney, Agent, or Firm* — F. Chau & Associates, LLC

(57) ABSTRACT

An image sensor may include a substrate having a first surface and a second surface on opposite sides, a first transistor having a first gate disposed on the first surface, a photoelectric conversion layer which generates photocharges from light incident in a first direction, a second transistor having a transistor structure disposed between the first surface and the photoelectric conversion layer and spaced from the photoelectric conversion layer, and includes a semiconductor layer composed of a metal oxide semiconductor material. The semiconductor layer may have a third surface facing the first direction and a fourth surface opposite the third surface, with a second gate disposed on the semiconductor layer. The semiconductor layer may be connected to the first gate. A light blocking layer may be disposed between the third surface and the photoelectric conversion layer, and spaced from the photoelectric conversion layer.

19 Claims, 34 Drawing Sheets

(51) Int. Cl.
  *H01L 27/30*    (2006.01)
  *H01L 29/786*   (2006.01)
  *H04N 5/369*    (2011.01)

(52) U.S. Cl.
  CPC ........ *H01L 27/307* (2013.01); *H01L 29/7869* (2013.01); *H04N 5/369* (2013.01)

(58) Field of Classification Search
  USPC .................................. 438/57; 257/444, 458
  See application file for complete search history.

(56) References Cited

U.S. PATENT DOCUMENTS

| | | |
|---|---|---|
| 9,443,893 B2 | 9/2016 | Yamazaki |
| 9,761,636 B2 | 9/2017 | Lee et al. |
| 9,793,324 B2 * | 10/2017 | Joei ...................... H01L 51/448 |
| 9,837,549 B2 | 12/2017 | Ikeda et al. |
| 9,947,700 B2 | 4/2018 | Yamazaki et al. |
| 10,074,697 B2 | 9/2018 | Yamaguchi |
| 10,157,952 B2 | 12/2018 | Tamaki et al. |
| 10,164,123 B2 | 12/2018 | Yoshii et al. |
| 10,276,818 B2 * | 4/2019 | Tamaki .................. H04N 5/374 |
| 10,727,262 B2 * | 7/2020 | Kato .................... H01L 27/307 |
| 10,903,278 B2 * | 1/2021 | Kataoka ............. H01L 27/146 |
| 2014/0218578 A1 | 8/2014 | Kohyama |
| 2015/0340394 A1 | 11/2015 | Hirase |
| 2015/0349008 A1 | 12/2015 | Yamaguchi |
| 2016/0191833 A1 | 6/2016 | Higashi et al. |
| 2016/0284749 A1 | 9/2016 | Kurokawa |
| 2016/0293654 A1 | 10/2016 | Tomekawa et al. |
| 2018/0286922 A1 | 10/2018 | Togashi |
| 2018/0301509 A1 | 10/2018 | Ishii et al. |
| 2021/0313381 A1 * | 10/2021 | Murata ............. H01L 27/14638 |

\* cited by examiner

IMAGE SENSOR WITH LIGHT BLOCKING LAYER

This application claims the benefit of Korean Patent Application No. 10-2019-0130339, filed on Oct. 21, 2019, in the Korean Intellectual Property Office, the disclosure of which is incorporated herein by reference in its entirety.

FIELD

The present disclosure relates generally to image sensors, and more particularly to image sensors including a light blocking layer.

DISCUSSION OF THE RELATED ART

An image sensor is a semiconductor device that converts optical information into an electrical signal. Examples of such image sensors include charge coupled device (CCD) image sensors and complementary metal-oxide semiconductor (CMOS) image sensors.

CMOS image sensors may be classified into front side illumination (FSI) CMOS image sensors in which light is incident upon a front side of a substrate and back side illumination (BSI) CMOS image sensors in which light is incident upon a back side of a substrate.

SUMMARY

Aspects of the present disclosure provide an image sensor having improved performance due to reduced leakage current and noise.

According to an aspect of the present disclosure, there is provided an image sensor comprising a substrate having a first surface and a second surface on opposite sides, a first transistor having a first gate disposed on the first surface, a photoelectric conversion layer which generates photocharges from light incident in a first direction, a second transistor having a transistor structure disposed between the first surface and the photoelectric conversion layer and spaced from the photoelectric conversion layer, and includes a semiconductor layer composed of a metal oxide semiconductor material. The semiconductor layer may have a third surface facing the first direction and a fourth surface opposite the third surface, with a second gate disposed on the semiconductor layer. The semiconductor layer may be connected to the first gate. A light blocking layer may be disposed between the third surface and the photoelectric conversion layer, and spaced from the photoelectric conversion layer.

According to another aspect of the present disclosure, there is provided an image sensor comprising a substrate with a first surface and a second surface on opposite sides, a source follower transistor having a first gate disposed on the first surface, a first photoelectric conversion layer, separate from the substrate, that generates first photocharges from incident light, a transistor structure which is disposed proximate to the first surface and comprises a semiconductor layer comprising a metal oxide semiconductor material and a second gate disposed on a central region of the semiconductor layer and a light blocking layer which is disposed between the first photoelectric conversion layer and the transistor structure, is spaced from the first photoelectric conversion layer, and covers at least a part of the semiconductor layer to block the semiconductor layer from the incident light. A first part of the semiconductor layer, located on a side of the second gate, is connected to the first gate and the first photoelectric conversion layer.

According to another aspect of the present disclosure, there is provided an image sensor comprising a substrate with a first surface and a second surface on opposite sides, a first transistor having a first gate disposed on the first surface of the substrate, a photoelectric conversion layer which is disposed in the substrate and generates photocharges from incident light, a second transistor having a transistor structure disposed proximate to the first surface of the substrate and comprises a semiconductor layer comprising a metal oxide semiconductor material and a second gate electrode disposed on the semiconductor layer, a light blocking layer which is disposed on the first surface of the substrate and covers at least a part of the semiconductor layer to block the semiconductor layer from the incident light and a capacitor structure, where a first part of the semiconductor layer located at an end portion of the semiconductor layer is connected to the first gate and the capacitor structure.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
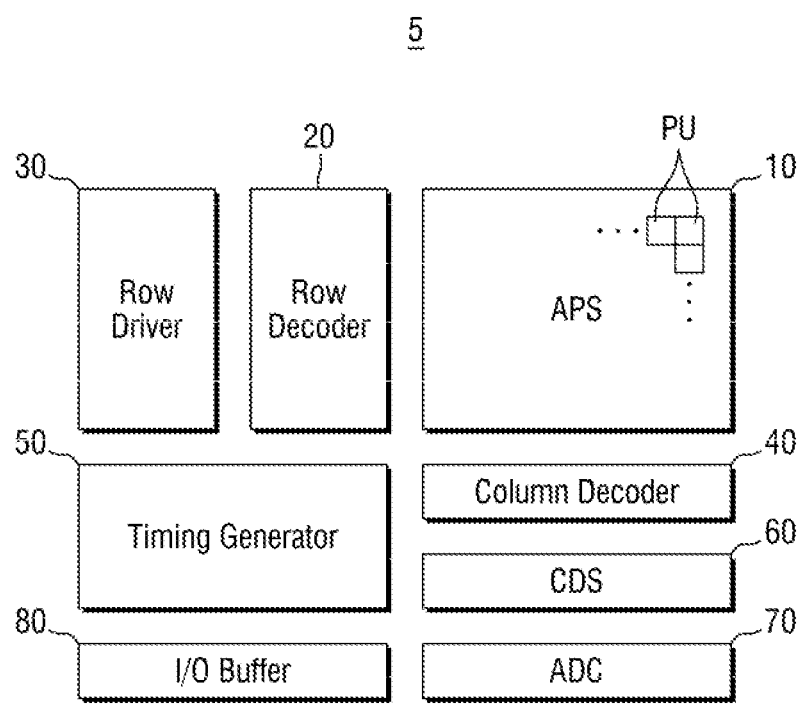
FIG. 1 is a block diagram of an image sensor according to an embodiment.

Image sensors according to various embodiments will now be described with reference to FIGS. 1 through 23E.

Herein, when an element of layer is said to be "on" or "disposed on", "connected to" or "coupled to" another element or layer, it can be directly on (i.e., a direct physical interface exists), directly connected or directly coupled to the other element or layer, or, an intervening element(s) or layer(s) may be present. If the context discusses a first element or layer being "on" a second element or layer, and refers to a drawing showing the relevant elements or layers physically interfacing, then the drawing provides an example of the first element or layer being "directly on" the second element or layer, without an intervening element or layer, but it is understood that the addition of an intervening element or layer may be possible in an alternative embodiment to that illustrated.

Herein, when a gate electrode is said to be "on" a surface or substrate, a gate dielectric layer such as a gate oxide layer may be interposed between the gate electrode and the surface or substrate. The combination of the gate electrode and the gate dielectric layer may be referred to as a "gate" of a transistor.

Herein, when a layer is said to include a particular material, the layer may be composed partially or wholly of that particular material.

FIG. 1 is a block diagram of an image sensor 5 according to an embodiment. The image sensor 5 may include an active pixel sensor (APS) array 10, a row decoder 20, a row driver 30, a column decoder 40, a timing generator 50, a correlated double sampler (CDS) 60, an analog-to-digital converter (ADC) 70, and an input/output (I/O) buffer 80.

The APS array 10 may include a plurality of unit pixel regions PU arranged in two dimensions and may convert optical signals into electrical signals. The APS array 10 may be driven by a plurality of driving signals such as a pixel selection signal, a reset signal, and a charge transfer signal received from the row driver 30. In addition, the electrical signals output from the APS array 10 may be provided to the CDS 60.

The row driver 30 may provide a plurality of driving signals for driving a plurality of unit pixel regions PU to the APS array 10 according to the decoding result of the row decoder 20. When the unit pixel regions PU are arranged in a matrix, the driving signals may be provided to each row.

The timing generator 50 may provide a timing signal and a control signal to the row decoder 20 and the column decoder 40.

The CDS 60 may receive the electrical signals generated by the APS array 10 and sample and hold the received electrical signals. The CDS 60 may double-sample a specific noise level and signal levels of the electrical signals and output difference levels between the noise level and the signal levels.

The ADC 70 may convert analog signals corresponding to the difference levels output from the CDS 60 into digital signals and output the digital signals.

The I/O buffer 80 may latch the digital signals and sequentially output the latched signals to an image signal processor (not illustrated) according to the decoding result of the column decoder 40.

Figure 2:
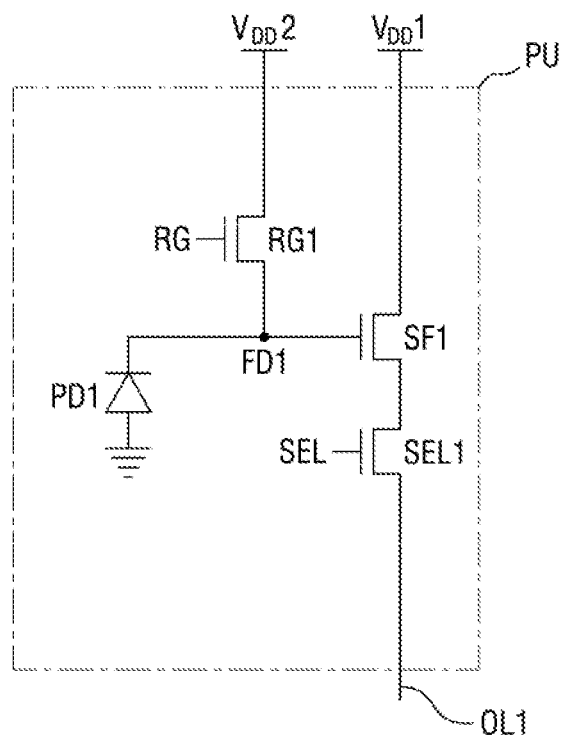
FIG. 2 is an example circuit diagram of a unit pixel region PU of the image sensor according to an embodiment.

FIG. 2 schematically illustrates an example circuit within the unit pixel region PU of the image sensor 5 (interchangeably, "pixel circuit PU"). The pixel circuit PU may include a first photoelectric converter PD1, a first floating diffusion region FD1, a first reset transistor RG1, a first source follower transistor SF1, and a first selection transistor SEL1.

The first photoelectric converter PD1 may absorb light and accumulate charges corresponding to the amount of light. The first photoelectric converter PD1 may be, for example, a photodiode, a phototransistor, a photogate, a pinned photodiode, an organic photodiode, quantum dots, or a combination of the same.

The charges accumulated in the first photoelectric converter PD1 may be stored in the first floating diffusion region FD1. The first floating diffusion region FD1 is a region that converts charges into a voltage and may cumulatively store charges due to its parasitic capacitance.

The first source follower transistor SF1 may serve as a source follower buffer amplifier controlled by the first floating diffusion region FD1. The first source follower transistor SF1 may amplify a change in an electric potential of the first floating diffusion region FD1 and output the amplified change to a first output line OL1. For example, a predetermined electric potential (e.g., a first power supply voltage $V_{DD}1$) provided to a drain of the first source follower transistor SF1 may be provided to the first output line OL1 under the control of the first floating diffusion region FD1.

The first selection transistor SEL1 may select unit pixel regions to be read on a row-by-row basis. The first selection transistor SEL1 may be driven by a selection line which applies a predetermined bias. For example, when the first selection transistor SEL1 is turned on by a signal SEL applied to its gate terminal, a predetermined electric potential (e.g., an electric potential provided from a source of the first source follower transistor SF1) provided to a drain of the first selection transistor SEL1 may be output to the first output line OL1.

Figure 3:
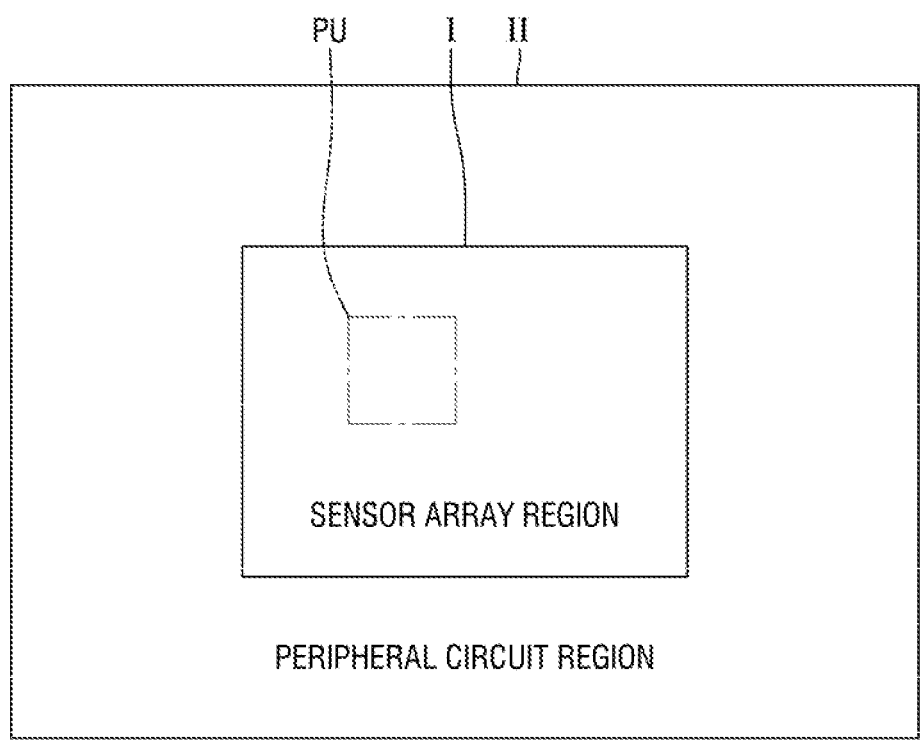
FIG. 3 is a schematic plan view of an image sensor according to an embodiment.
Figure 4:
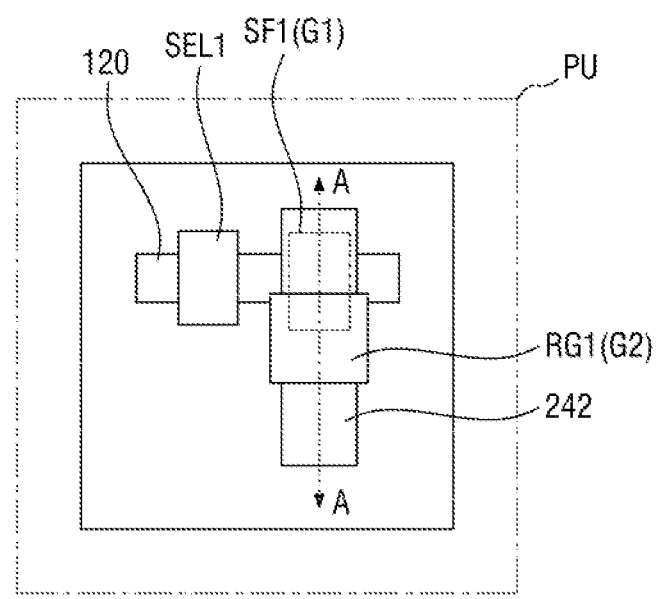
FIG. 4 is a schematic layout view of a unit pixel region PU of the image sensor according to an embodiment.

The first reset transistor RG1 may periodically reset the first floating diffusion region FD1. The first reset transistor RG1 may be driven by a reset line which applies a predetermined bias. For example, when the first reset transistor RG1 is turned on by a signal RG applied to its gate terminal, a predetermined electric potential (e.g., a second power supply voltage $V_{DD}2$) provided to a drain of the first reset transistor RG1 may be transferred to the first floating diffusion region FD1, FIG. 3 is a schematic plan view of the image sensor 5 according to an embodiment. FIG. 4 is an example schematic layout view of a unit pixel region PU of the image sensor 5 As shown in FIG. 3, the image sensor 5 may include a sensor array region I and a peripheral circuit region PU.

The sensor array region I may be, for example, a region in which the APS array 10 of FIG. 1 is formed. For example, the sensor array region I may include a plurality of unit pixel regions II.

The peripheral circuit region II may be, for example, a region in which the CDS 60, the ADC 70, etc. of FIG. 1 are formed. In FIG. 3, the peripheral circuit region II surrounds the sensor array region I. In other embodiments, the peripheral circuit region II overlaps the sensor array region I. For example, the peripheral circuit region II may be formed in a lower substrate, and the sensor array region I may be formed in an upper substrate stacked on the lower substrate.

The example unit pixel region PU illustrated in FIG. 4 depicts regions where the transistors SEL1, SF1 and RG1 may be arranged. In examples described hereafter, the source follower transistor has a first gate electrode G1 and the first reset transistor RG1 has a second gate electrode G2.

The region 120 may be an active region forming a circuit path between source and drain of each of transistors SEL1 and SF1. Note that in the example of FIG. 4, only one pixel is formed in a unit pixel region PU, but in other embodiments, a plurality of pixels may be formed in a unit pixel region PU.

Figure 5:
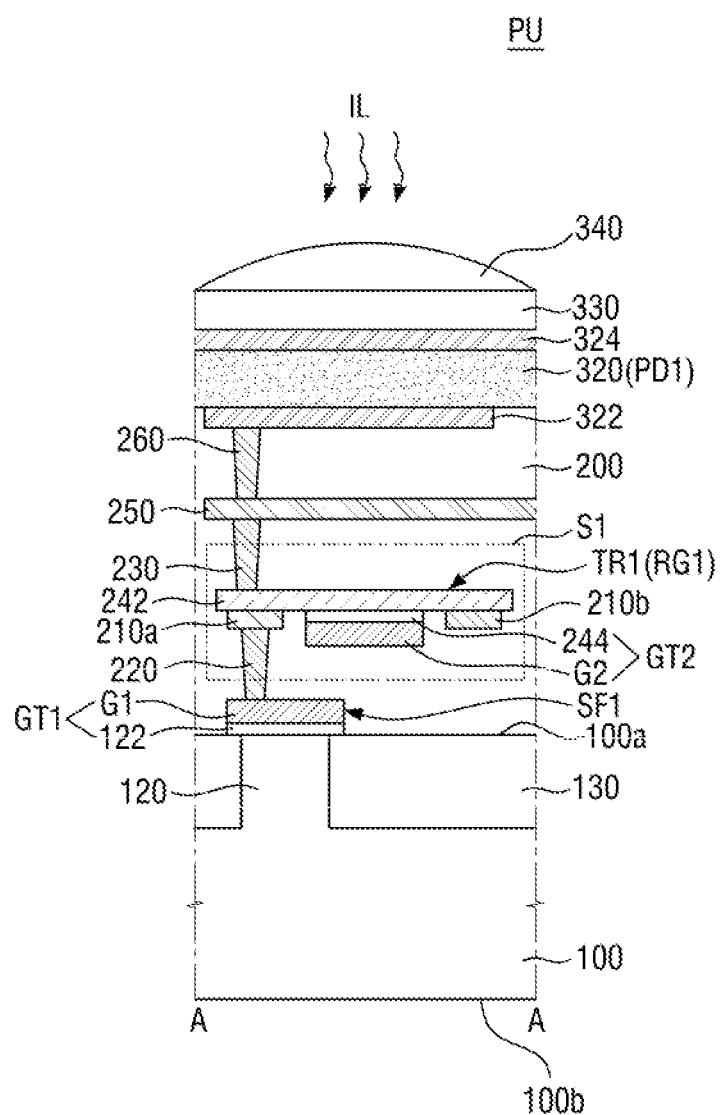
FIG. 5 is a cross-sectional view taken along line A-A of FIG. 4.

FIG. 5 is a cross-sectional view taken along line A-A of FIG. 4, FIGS. 6A through 6E depict various alternative configurations that may be used for a transistor structure and connection structures of region S1 of FIG. 5. Referring to FIGS. 2 through 6A, an exemplary pixel unit PU of the image sensor 5 includes a substrate 100, a device isolation layer 130, a first interlayer insulating film 200, a first gate electrode G1, a first photoelectric conversion layer 320, a first transistor structure TR1, a first light blocking layer 250, and a microlens 340.

The substrate 100 may be, for example, bulk silicon or silicon-on-insulator (SOI). Alternatively, the substrate 100 may be a silicon substrate or a substrate made of another material such as silicon germanium, indium antimonide, lead telluride, indium arsenide, indium phosphide, gallium arsenide, or gallium antimonide. Alternatively, the substrate 100 may be composed of a base substrate and an epitaxial layer formed on the base substrate.

The substrate 100 may include a first surface 100a and a second surface 100b on opposite sides thereof. The first surface 100a may be a front side of the substrate 100, and the second surface 100b may be a back side of the substrate 100. For example, the first surface 100a of the substrate 100 may be used to place various transistors for processing an electrical signal generated by the first photoelectric conversion layer 320. For example, the first source follower transistor SF1 and the selection transistor SEL1 may each include the active region 120 (a doped region) formed within the substrate 100, and may each have gate, source and drain electrodes formed on the first surface 100a. The first reset transistor RG1 may have a transistor structure TR1 partially supported by a first interlayer insulating film 200 formed over the first surface 100a.

Incident light IL may be incident on the first surface 100a of the substrate 100. For example, the incident light IL may be incident in a first direction from outside the image sensor. Here, the first surface 100a may face the first direction.

The active region 120 may be a doped region of the substrate 100 surrounded by the device isolation layer 130, The device isolation layer 130 may be formed in the substrate 100 from the first surface 100a. The device isolation layer 130 may be formed by filling an insulating material in a trench formed by patterning the substrate 100, Accordingly, edges of the device isolation layer 130 may define a part of the unit pixel region PU as the active region 120. Note that the surface 100a, although mainly described herein as a surface of the substrate 100, may be a planar surface that extends across an area of the device isolation area 130 and therefore may be defined as partially a surface of the device isolation area 130 and partially a surface of the substrate 100. Hereafter, reference to the surface 100a will be a general reference to any portion of the surface unless the context dictates otherwise.

The first interlayer insulating film 200 may be formed on the first surface 100a. The first interlayer insulating film 200 may include at least one of, fix example, silicon oxide, silicon nitride, silicon oxynitride, and a low dielectric constant (low-k) material having a lower dielectric constant than silicon oxide.

The first gate electrode (31 may be formed on the first surface 100a of the substrate 100. (As mentioned above, herein, a gate electrode may be considered to be disposed "on" a surface even though a gate dielectric layer, such as the first gate dielectric layer 122 discussed below, is present between the gate electrode and the surface.) The first gate electrode G1 may be formed in the first interlayer insulating film 200, and may function as a gate electrode of the first source follower transistor SF1. The first gate electrode G1 may be part of a patterned metal layer that forms other gate electrodes (not shown) such as a gate electrode for the first selection transistor SEL1.

The first gate electrode G1 may be formed directly on a first gate dielectric layer 122, which is formed directly on the active region 120. The first gate electrode G1 and the first gate dielectric layer 122 may together constitute a first gate GT1, which is a gate of the source follower transistor SF1. The first gate GT1 may be disposed on the surface 100a as illustrated in FIG. 5.

The first gate dielectric layer 122 may include, for example, silicon oxide, silicon nitride, silicon oxynitride, or a high dielectric constant (high-k) material having a higher dielectric constant than silicon oxide. The first gate electrode G1 may include a metal material such as tungsten (W), titanium (Ti), titanium nitride (TiN), copper (Cu), or aluminum (Al). Alternatively, the first gate electrode G1 may include a metal oxide such as indium tin oxide (ITO) or indium zinc oxide (IZO) or a semiconductor material such as doped silicon.

The first photoelectric conversion layer 320 may generate first photocharges in proportion to the amount of the incident light IL incident from the exterior. That is, the first photoelectric conversion layer 320 may receive light and convert an optical signal into an electrical signal. For example, the first photoelectric conversion layer 320 may correspond to the first photoelectric converter PD1 of FIG. 2.

In the embodiment of FIG. 5, the first photoelectric conversion layer 320 is formed spaced from the substrate 100. For example, the first photoelectric conversion layer 320 may be formed on a top surface of the first interlayer insulating film 200, whereby it is spaced from the first surface 100a by the first interlayer insulating film 200.

A first lower electrode 322 and a first upper electrode 324 may each be formed adjacent to the first photoelectric conversion layer 320 on opposite sides. Thus, the first photoelectric conversion layer 320 may be interposed between the first lower electrode 322 and the first upper electrode 324. For example, the first lower electrode 322 may extend along a bottom surface of the first photoelectric conversion layer 320, and the first upper electrode 324 may extend along an upper surface of the first photoelectric conversion layer 320. In FIG. 5, the first lower electrode 322 is illustrated as having edges abutting a top portion of the first interlayer insulating film 200 beneath the first photoelectric conversion layer 320, but in other examples the first lower electrode 322 extends completely across a lower surface of first photoelectric conversion layer 320.

Different levels of voltages may be applied to the first lower electrode 322 and the first upper electrode 324, respectively. For example, different respective levels of voltages may be applied to the first lower electrode 322 and the first upper electrode 324 so that an electrical signal generated by the first photoelectric conversion layer 320 is directed to the first lower electrode 322.

The first lower electrode 322 and the first upper electrode 324 may include a transparent conductive material. For example, the first lower electrode 322 and the first upper electrode 324 may include indium tin oxide (ITO), zinc oxide (ZnO), tin dioxide ($SnO_2$), antimony-doped tin oxide (ATO), aluminum-doped zinc oxide (AZO), gallium-doped zinc oxide (GZO), titanium dioxide (TiO$_2$), fluorine-doped tin oxide (FTO), or combinations of the same. The first lower electrode 322 and the first upper electrode 324 may include the same material or different materials.

The first photoelectric conversion layer 320 may include an organic photoelectric conversion layer.

The first transistor structure TR1 may be formed proximate to the first surface 100a For example, the first transistor structure TR1 may be formed in the first interlayer insulating film 200. The first transistor structure TR1 may be spaced apart from each of the substrate 100 and the first photoelectric conversion layer 320, interposed between the substrate 100 and the first photoelectric conversion layer 320, and closer to the substrate 100 than to the first photoelectric conversion layer 320.

The first transistor structure TR1 may include a first semiconductor layer 242, a second gate dielectric layer 244, and a second gate electrode G2. The first semiconductor layer 242 may include a semiconductor material. For example, the first semiconductor layer 242 may include a metal oxide semiconductor material such as indium gallium zinc oxide (IGZO) or indium tin zinc oxide (ITZO), an elemental semiconductor material such as polysilicon or amorphous silicon, an organic semiconductor material, a carbon semiconductor material such as graphene or carbon nanotubes (CNTs), or combinations of the same. Additionally or alternatively, the first semiconductor layer 242 may include any one of CdSe, CdS, ZnO, SnO$_2$, MoS$_2$, TiO$_2$, Fe$_2$O$_3$, WO$_3$, InGaZnO, ZnO—Rh$_2$O$_3$, In$_2$O$_3$, ZnSnO, InGaO, InZnO, ZnSnO, or combinations of the same.

When the first semiconductor layer 242 includes IGZO, leakage current may be effectively reduced.

Figure 6A:
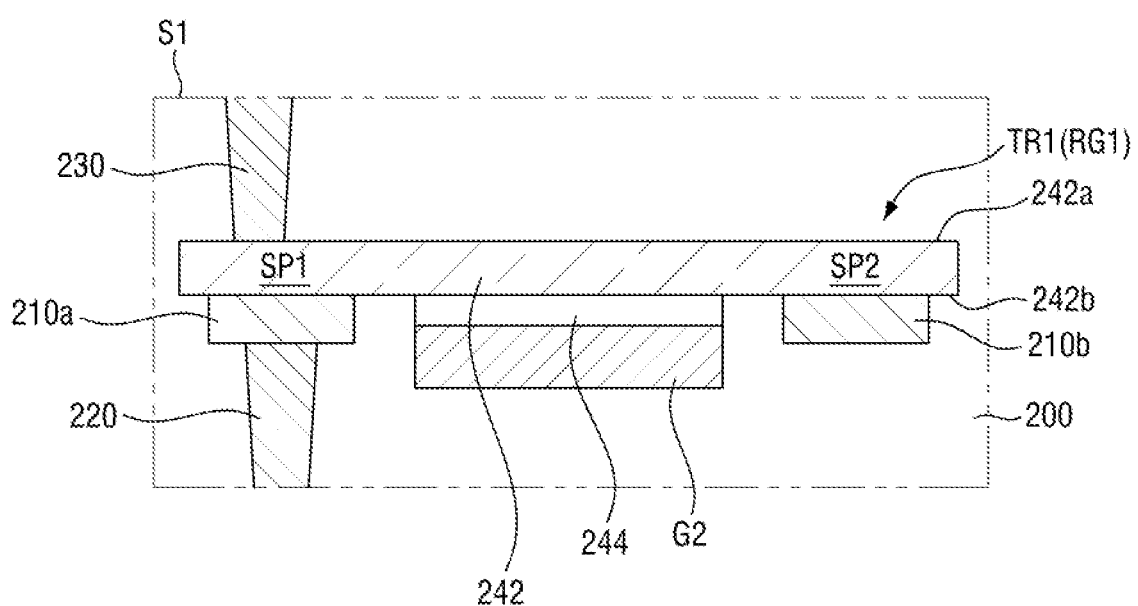
FIGS. 6A, 6B, 6C, 6D and 6E depict various alternative configurations that may be used for a transistor structure and connection structures in region S1 of FIG. 5.

FIG. 6A is an enlarged view of the region Si shown in FIG. 5. In the example of FIG. 6A, the first semiconductor layer 242 may include a third surface 242a and a fourth surface 242b which are opposite each other. The third surface 242a of the first semiconductor layer 242 may be defined as a direction facing the first direction in which the incident light IL is incident. That is, the incident light IL may be incident from outside the image sensor toward the third surface 242a of the first semiconductor layer 242.

The second gate electrode G2 may be formed on the first semiconductor layer 242.

The second gate electrode G2 may be formed on the fourth surface 242b. Accordingly, the second gate electrode G2 may be interposed between the substrate 100 and the first semiconductor layer 242.

The second gate electrode G2 may be formed directly below a central portion of the first semiconductor layer 242, where the central portion is between a first part SP1 and a second part SP2 of the first semiconductor layer 242. The first parts SP1 and SP2 may be respective end portions of the first semiconductor layer 242 on opposite ends thereof.

The second gate electrode G2 may include a conductive material. For example, the second gate electrode G2 may include a metal material such as tungsten (W), titanium (Ti), titanium nitride (TiN), copper (Cu), or aluminum (Al). Alternatively, the second gate electrode G2 may include, for example, a metal oxide such as indium tin oxide (ITO) or indium zinc oxide (IZO) or a semiconductor material such as doped silicon.

The second gate dielectric layer 244 may be interposed between the first semiconductor layer 242 and the second gate electrode G2. For example, the second gate dielectric layer 244 may extend conformally along the profile of the fourth surface 242b. The second gate electrode G2 and the second gate dielectric layer 244 may together constitute a second gate GT2 which is formed on the fourth surface 242b in the central region of the first semiconductor layer 242.

The second gate dielectric layer 244 may include, for example, silicon oxide, silicon nitride, silicon oxynitride, or a high-k material having a higher dielectric constant than silicon oxide.

The first part SP1 of the first semiconductor layer 242 may form the first floating diffusion region FD1 discussed earlier. For example, referring to FIG. 5, the first part SP1 may form a source region (interchangeably, just "source" or source electrode) of the first reset transistor RG1 and may be electrically connected to each of the first gate electrode G1 and the first photoelectric conversion layer 320. (The second part SP2 may form a drain of the first reset transistor RG1. Alternatively, the first part SP1 forms the drain and the second part SP2 forms the source of the first reset transistor RG1.) Accordingly, the first photocharges generated by the first photoelectric conversion layer 320 may be stored in the first part SP1. In addition, the first source follower transistor SF1 including the first gate electrode G1 may amplify a change in an electric potential of the first part SP1.

Since the first floating diffusion region FD1 of the image sensor according to the embodiments does not contact the substrate 100, a contact leakage current between the first floating diffusion region FD1 and the substrate 100 can be effectively reduced.

As mentioned, the first transistor structure TR1 including the first semiconductor layer 242 may form the first reset transistor RG1. For example, a predetermined electric potential (e.g., a second power supply voltage $V_{DD}2$) may be provided to the second part SP2. When the second gate electrode G2 is turned on, the predetermined electric potential provided to the second part SP2 may be channeled to the first part SP1. Accordingly, the second gate electrode G2 may function to periodically reset the first part SP1.

With continuing reference to FIGS. 5 and 6A, in the image sensor 5, the first gate electrode G1 may be connected to the fourth surface 242b, and the first photoelectric conversion layer 320 may be connected to the third surface 242a.

For example, a first via 220 connected to the fourth surface 242b and a second via 230 connected to the third surface 242a may be formed in the first interlayer insulating film 200. Herein, a via may be a vertically oriented conductive conduit, typically formed by filling a through hole with conductive material, that electrically connects conductive elements at different vertical levels of a circuit structure (where the vertical direction is in a thickness direction of the circuit structure.) The first gate electrode G1 may be connected to the first semiconductor layer 242 through the first via 220, and the first photoelectric conversion layer 320 may be connected to the first semiconductor layer 242 through the second via 230 and a third via 260.

A first conductive pad 210a and a second conductive pad 210b may be formed on the first semiconductor layer 242. The first conductive pad 210a may be connected to the first part SP1 and the second conductive pad 210b may be connected to the second part SP2. The first conductive pad 210a and the second conductive pad 210b may each be formed on the fourth surface 242b. In this case, the first via 220 may be connected to the first semiconductor layer 242 through the first conductive pad 210a. The second conductive pad 210b may provide a predetermined electric potential (e.g., the second power supply voltage $V_{DD}2$) to the second part SP2.

The first light blocking layer 250 may be formed proximate to the third surface 242a. For example, the first light blocking layer 250 may be formed in a portion of the first interlayer insulating film 200 directly above the third surface 242a. The first light blocking layer 250 may be spaced apart from the first photoelectric conversion layer 320 by an upper portion of the first interlayer insulating film 200. The first light blocking layer 250 may be interposed between the first transistor structure TR1 and the first photoelectric conversion layer 320.

The first light blocking layer 250 may cover at least a part of the third surface 242a (e.g., the entire third surface 242a) to block it from the incident light IL. That is, the first light blocking layer 250 may prevent penetration of the incident light IL into the first semiconductor layer 242. Accordingly, noise generated in the first semiconductor layer 242 due to the incident light IL can be reduced, and as a result the image sensor 5 may have improved performance relative to conventional image sensors.

The first light blocking layer 250 may be made of an electrically conductive material, and may be electrically connected to the first semiconductor layer 242. For example, the first light blocking layer 250 may be connected to the second via 230. The first light blocking layer 250 may be connected to the first photoelectric conversion layer 320. For example, the third via 260 may be formed in the first interlayer insulating film 200 to connect the first light blocking layer 250 and the first lower electrode 322. Accordingly, the first photoelectric conversion layer 320 may be connected to the third surface 242a by the first lower electrode 322, the third via 260, the first light blocking layer 250, and the second via 230. If the first light blocking layer 250 is composed of a non-conductive material, another via (not shown) may be formed within the first light blocking layer to connect the first via 230 and the third via 260.

The microlens 340 may be formed on the first upper electrode 324. The microlens 340 may have a convex shape and a predetermined radius of curvature. Accordingly, the microlens 340 may concentrate the incident light IL.

The microlens 340 may include, for example, an organic material such as a light transmitting resin.

The image sensor 5 may further include a protective layer 330 interposed between the first upper electrode 324 and the microlens 340. The protective layer 330 may include a transparent insulating material. The protective layer 330 may include, for example, silicon oxide or metal oxide.

Figure 6B:
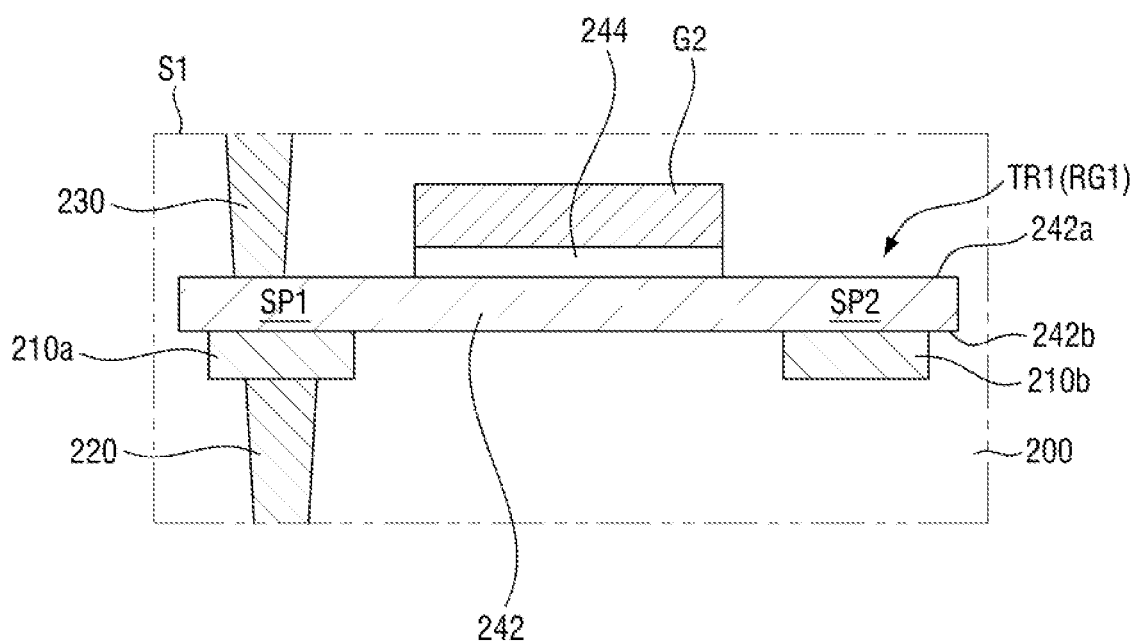

FIG. 6B illustrates another example for a structure of circuit elements in the region S1 of the image sensor 5. In this embodiment, a second gate electrode G2 and a second gate dielectric layer 244 may be formed on a third surface 242a of a first semiconductor layer 242.

Figure 6C:
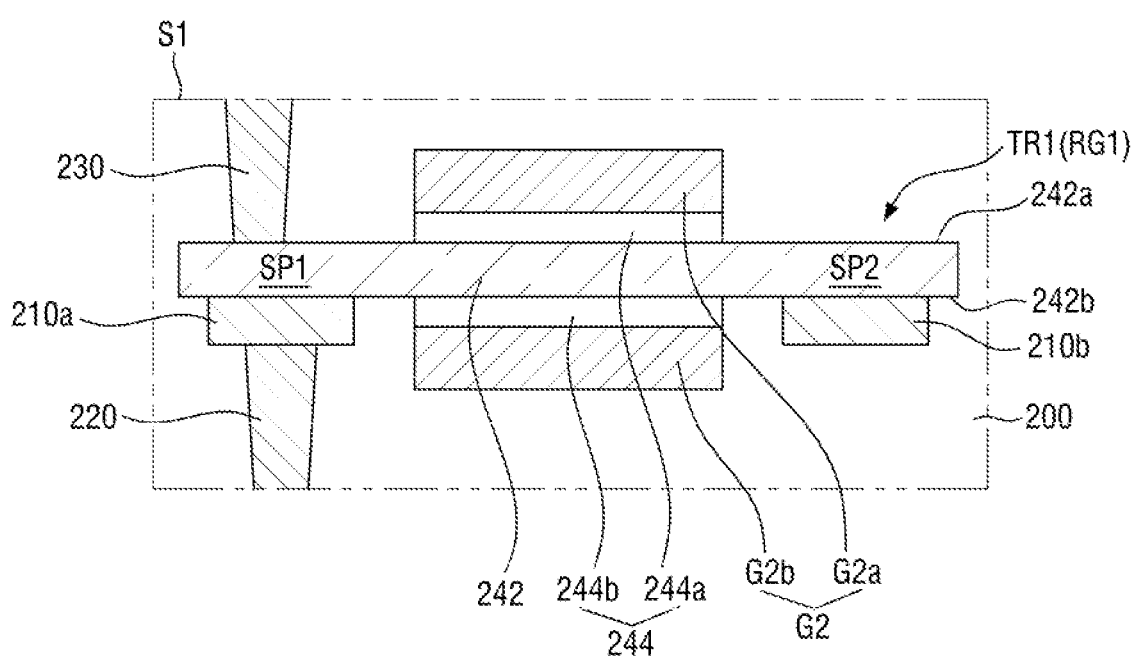

FIG. 6C shows still another example for the structure of elements within the region S1 in the image sensor 5. Here, a second gate electrode G2 and a second gate dielectric layer 244 may be formed on both the third surface 242a and the fourth surface 242b of the first semiconductor layer 242. For example, the second gate electrode G2 may include an upper gate electrode G2a and a lower gate electrode G2b, and the second gate dielectric layer 244 may include an upper gate dielectric layer 244a and a lower gate dielectric layer 244b. The upper gate electrode G2a and the upper gate dielectric layer 244a may be formed on the third surface 242a, and the lower gate electrode G2b and the lower gate dielectric layer 244b may be formed on the fourth surface 242b.

Figure 6D:
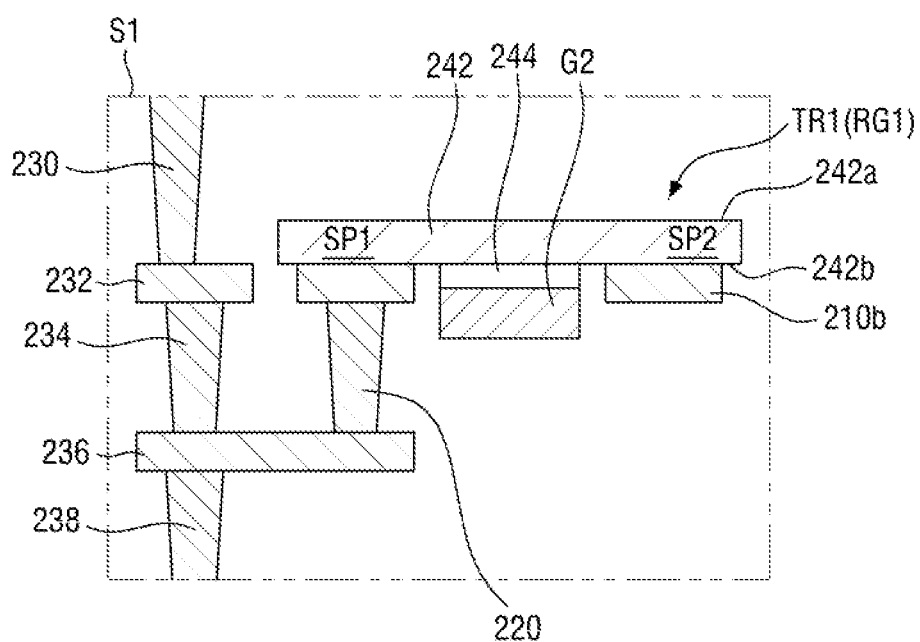

FIG. 6D depicts still another example for the structure of circuit elements in the region S1. In this case, the first gate electrode G1 (seen in FIG. 5) and a first photoelectric conversion layer 320 may be connected to a fourth surface 242b of a first semiconductor layer 242.

For example, a second via 230 connected to the first photoelectric conversion layer 320 may be connected to a first via 220 connected to the fourth surface 242b. For example, a first conductive wiring 232, a fourth via 234, and a second conductive wiring 236 may be formed in a first interlayer insulating film 200 to connect a bottom surface of the second via 230 and a bottom surface of the first via 220. (Note that various conductive wirings discussed herein, such as the conductive wirings 232 and 236, may be substituted with contact pads or wires.) Accordingly, a first part SP1 of the first semiconductor layer 242 may be connected to the first photoelectric conversion layer 320 through the first via 220, the second conductive wiring 236, the fourth via 234, the first conductive wiring 232, and the second via 230. Thus, the first part SP1 may be connected to the first gate electrode G1 through the first via 220, the second conductive wiring 236, and a fifth via 238.

Figure 6E:
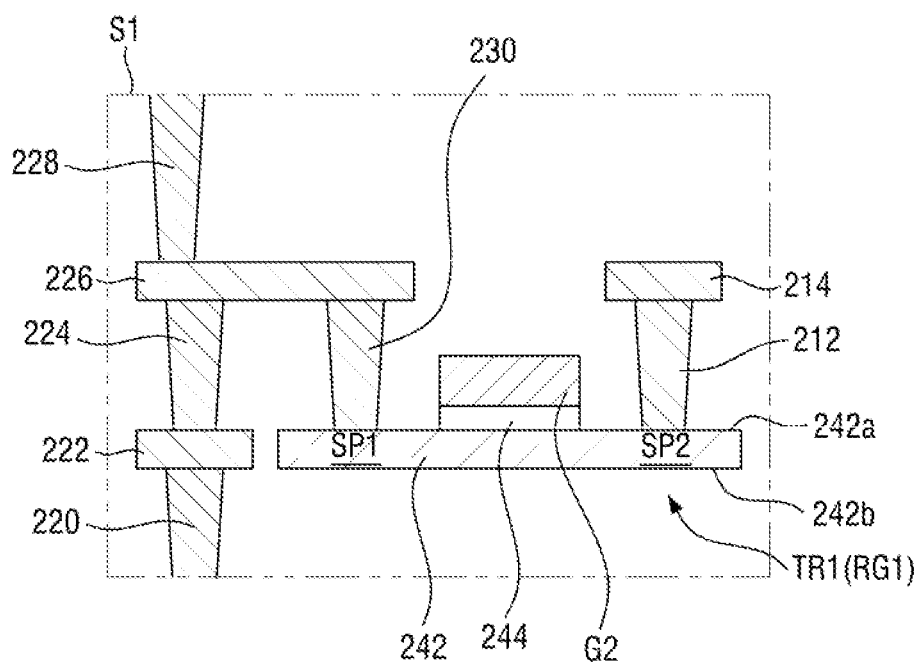

FIG. 6E depicts yet another example for the structure of elements in the region Si in the image sensor 5. In this case, a first gate electrode G1 (seen in FIG. 5) and a first photoelectric conversion layer 320 may be connected to a third surface 242a of a first semiconductor layer 242.

For example, a first via 220 connected to the first gate electrode G1 may be connected to a second via 230 connected to the third surface 242a of the first semiconductor layer 242. For example, a third conductive wiring 222, a sixth via 224, and a fourth conductive wiring 226 may be formed in a first interlayer insulating film 200 to connect an upper surface of the first via 220 and an upper surface of the second via 230. Accordingly, a first part SP1 of the first semiconductor layer 242 may be connected to the first gate electrode G1 through the second via 230, the fourth conductive wiring 226, the sixth via 224, the third conductive wiring 222, and the first via 220. The first part SP1 of the first semiconductor layer 242 may be connected to the first gate electrode G1 through the second via 230, the fourth conductive wiring 226, and a seventh via 228.

Figure 7:
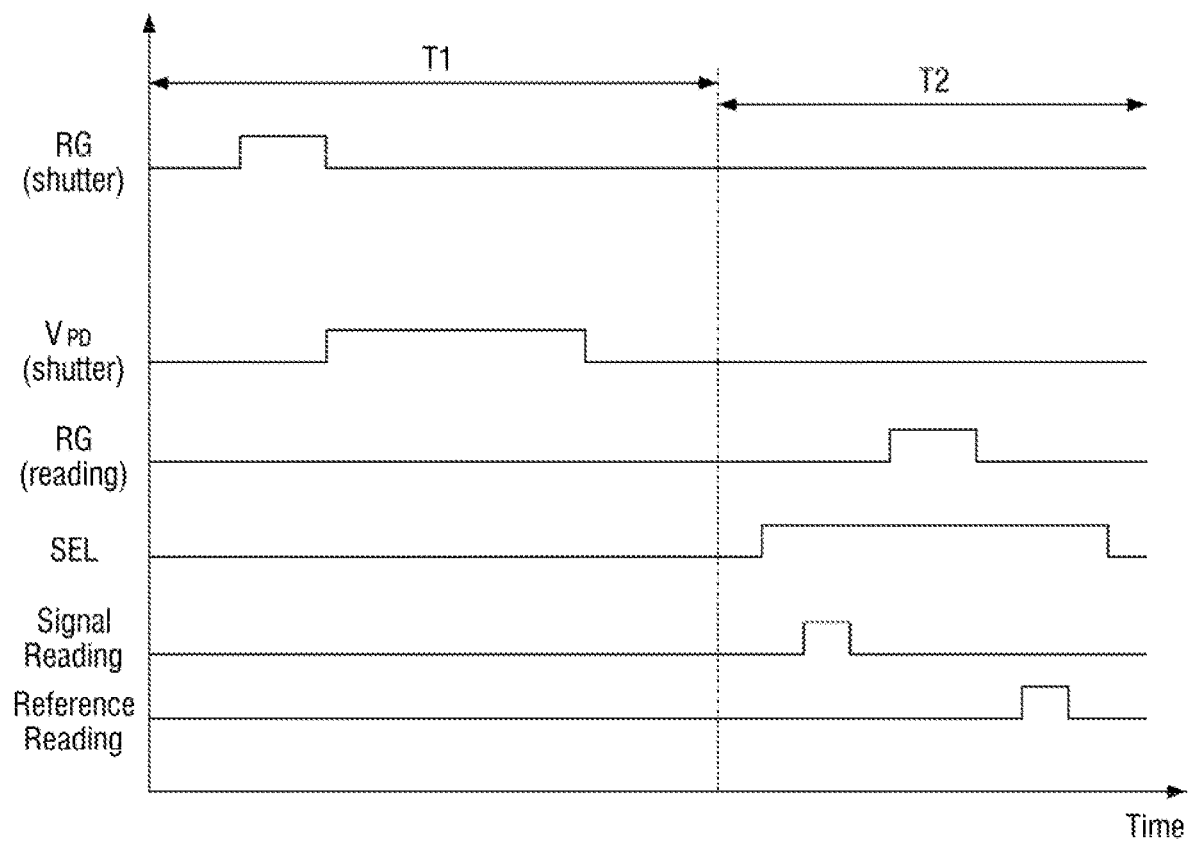
FIG. 7 is an example timing diagram for explaining the operation of an image sensor according to an embodiment.

FIG. 7 is an example timing diagram for explaining the operation of an image sensor 5. For ease of description, a description of elements and features described above in connection with FIGS. 1 through 6E will be given briefly or omitted.

Referring to FIG. 7, the image sensor 5 may perform a global shutter operation. First, during a first time period T1, electrical signals for all unit pixel regions PU of an APS array 10 may be stored. For example, first reset transistors RG1 of all unit pixel regions PU may be turned on by a pulse of the signal RG to reset electrical signals for first floating diffusion regions FD1 of all unit pixel regions PU ("RG (shutter)" applied during time period T1). Then, first photoelectric converters PD1 of all unit pixel regions PU may generate first photoelectric charges ("$V_{PD}$(shutter)"). Accordingly, electrical signals may be stored in the first floating diffusion regions FD1 of all unit pixel regions PU.

Next, during a second time T2, electrical signals for each row of unit pixel regions PU may be output. For example, first selection transistor SEL1 may be turned on to select unit pixel regions to be read on a row-by-row basis (during the pulse of the SEL signal, i.e., when SEL is at a high level). Then, electrical signals of the selected row of unit pixel regions PU may be output to first output line OL1 ("signal reading", which occurs while the SEL signal is high). Next, the electrical signals of the selected row of unit pixel regions PU may be reset (RG (reading) while the SEL signal is high). Then, the electrical signals of the selected row of unit pixel regions PU may be output again to the first output lines OL1 ("reference reading", which also occurs while the SEL signal is high). Accordingly, a CDS 60 may output difference levels corresponding to differences between the noise level and the signal level.

Figure 8:
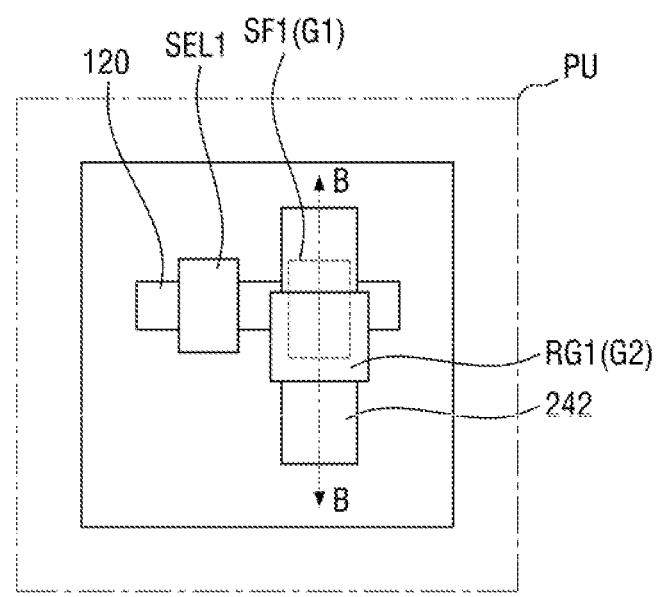
FIG. 8 is a schematic layout view of a unit pixel region PU of an image sensor according to an embodiment.
Figure 9:
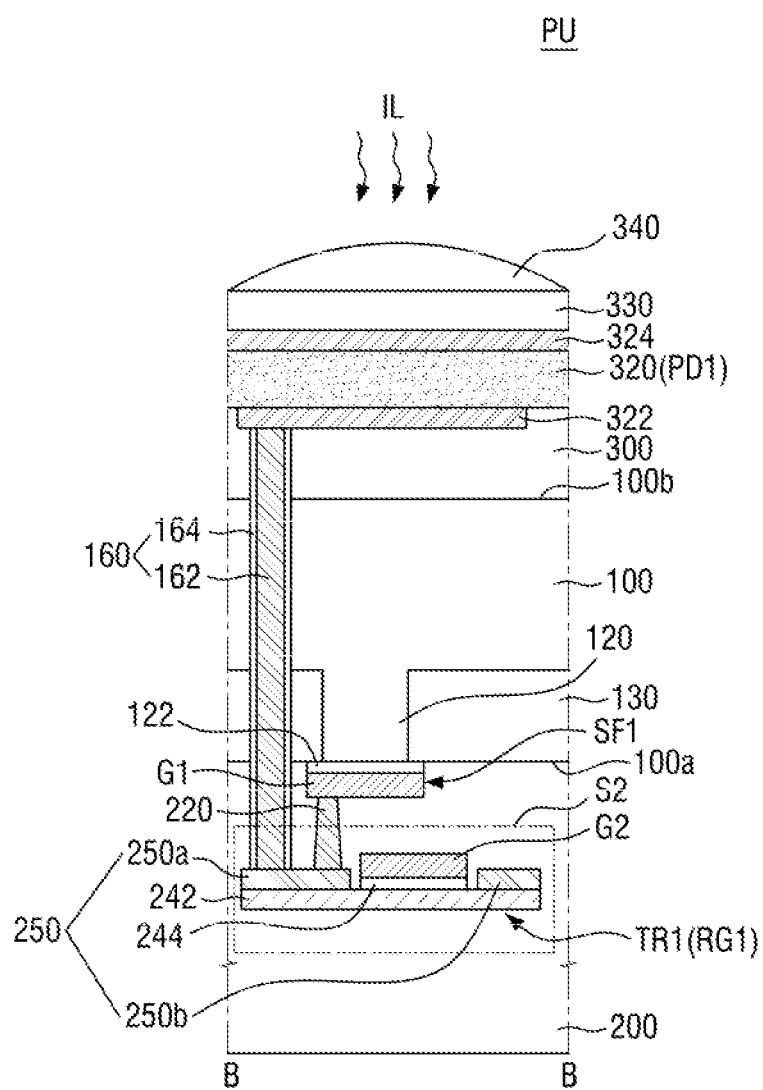
FIG. 9 is a cross-sectional view taken along line B-B of FIG. 8.

FIG. 8 is a schematic layout view of another example of a unit pixel region PU of the image sensor 5 according to an embodiment. FIG. 9 is a cross-sectional view taken along line B-B of FIG. 8. FIGS. 10A through 10E are various enlarged views of respective examples for region S2 of FIG. 9. For ease of description, a description of elements and features described above in connection with FIGS. 1 through 7 will be given briefly or omitted.

Referring to FIGS. 8 through 10A, in this example of the image sensor 5, incident light IL may be incident on a second surface 100b of a substrate 100. For example, the second surface 100b of the substrate 100 may face the incident light IL incident in the first direction. A first photoelectric conversion layer 320 may be formed on the second surface 100b of the substrate 100. For example, a second interlayer insulating film 300 may be formed on the second surface 100b of the substrate 100, and the first photoelectric conversion layer 320 may be formed on the second interlayer insulating film 300. That is, the first photoelectric conversion layer 320 may be spaced apart from the substrate 100 by the second interlayer insulating film 300.

Figure 10A:
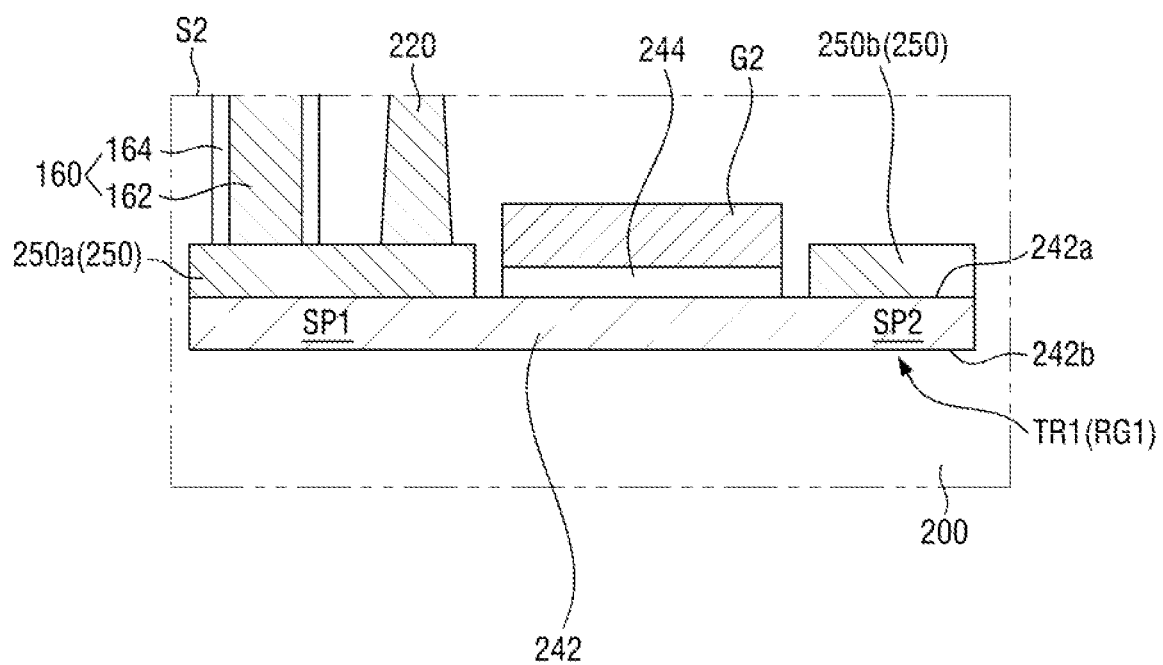
FIGS. 10A, 10B, 10C, 10D and 10E are various enlarged views of respective examples for region S2 of FIG. 9.

Referring to FIGS. 9 and 10A, in the image sensor according to the embodiments, a first gate electrode G1 and the first photoelectric conversion layer 320 may be connected to a third surface 242a of a first semiconductor layer 242.

For example, a first via 220 connected to the third surface 242a of the first semiconductor layer 242 may be formed in a first interlayer insulating film 200. The first gate electrode G1 may be connected to the first semiconductor layer 242 through the first via 220.

In some embodiments, a first "through via" 160 may penetrate the substrate 100 and may be connected to the third surface 242a of the first semiconductor layer 242. The first photoelectric conversion layer 320 may be connected to the first semiconductor layer 242 through the first through via 160. The first through via 160 may include a first "plug pattern" 162 (a conductive plug) including a conductive material and first spacers 164 including an insulating material. The first plug pattern 162 may be electrically insulated from the substrate 100 by the first spacers 164. The spacers 164 may be hollow cylindrical structures.

A first light blocking layer 250 may contact the third surface 242a of the first semiconductor layer 242. For example, the first light blocking layer 250 may include a first sub-blocking layer 250a which contacts a first part SP1 of the first semiconductor layer 242 and a second sub-blocking layer 250b which contacts a second part SP2 of the first semiconductor layer 242. The first sub-blocking layer 250a may cover a part of the third surface 242a of the first semiconductor layer 242, and the second sub-blocking layer 250b may cover another part of the third surface 242a of the first semiconductor layer 242.

The first light blocking layer 250 may be a composed of a conductive material and may be electrically connected to the first gate electrode G1 and the first photoelectric conversion layer 320. For example, the first through via 160 and the first via 220 may contact the first sub-blocking layer 250a.

Figure 10B:
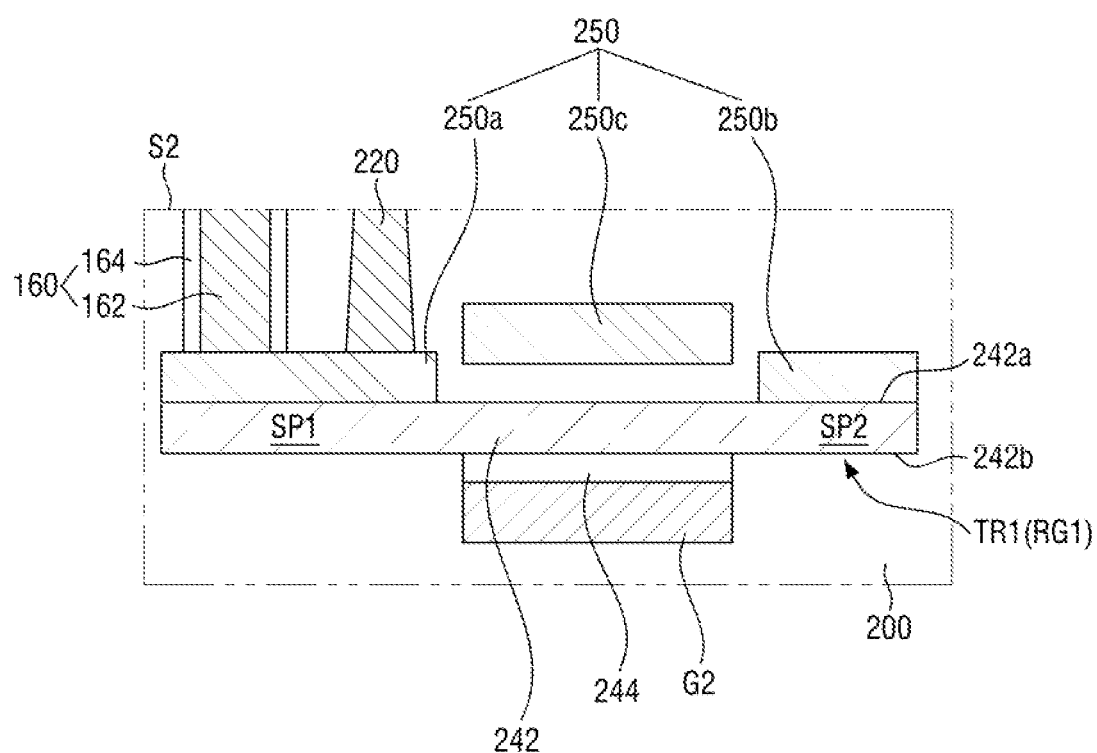

Referring to FIGS. 9 and 10B, in an image sensor 5 that employs an alternative example structure for the region S2, a second gate electrode G2 and a second gate dielectric layer 244 may be formed on a fourth surface 242b of a first semiconductor layer 242. A first light blocking layer 250 may further include a third sub-blocking layer 250c. The third sub-blocking layer 250c may be interposed between a first sub-blocking layer 250a and a second sub-blocking layer 250b to cover a region of a third surface 242a of the first semiconductor layer 242 which is not covered by the first sub-blocking layer 250a and the second sub-blocking layer 250b.

Figure 10C:
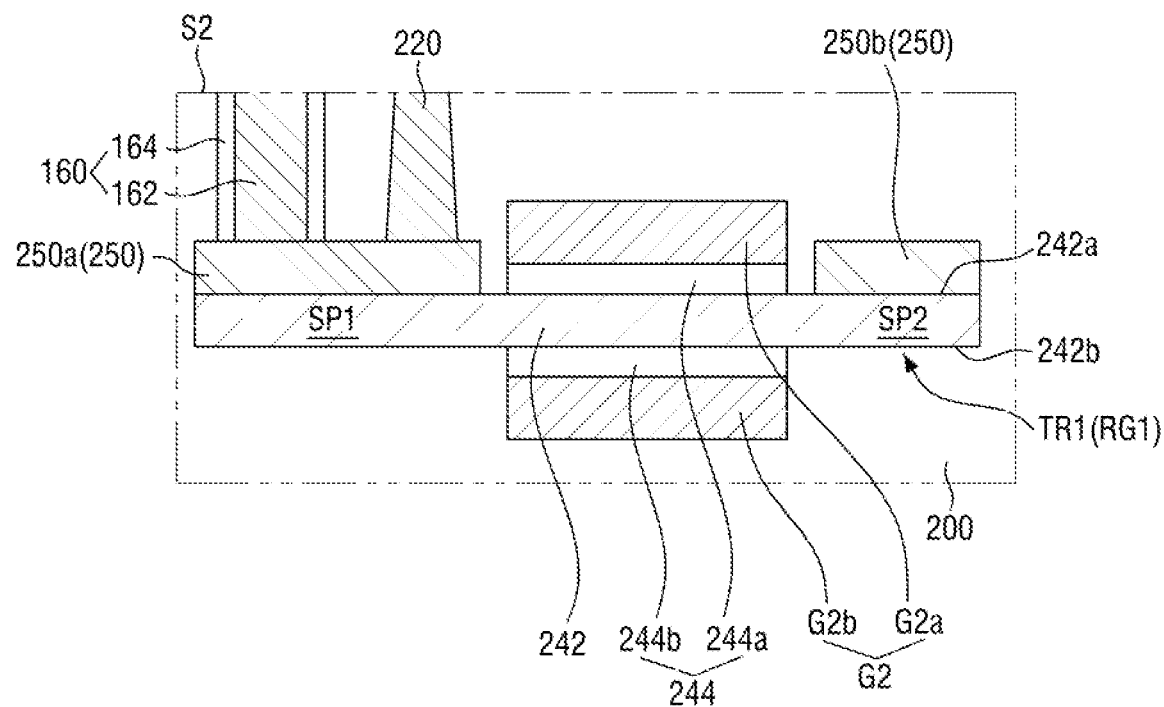

Referring to FIGS. 9 and 10C, in an image sensor 5 utilizing still another alternative example structure for the region S2, a second gate electrode G2 and a second gate dielectric layer 244 may be formed on both a third surface 242a and a fourth surface 242b of a first semiconductor layer 242. For example, an upper gate electrode G2a and an upper gate dielectric layer 244a may be formed on the third surface 242a of the first semiconductor layer 242, and a lower gate electrode G2b and a lower gate dielectric layer 244b may be formed on the fourth surface 242b of the first semiconductor layer 242.

Figure 10D:
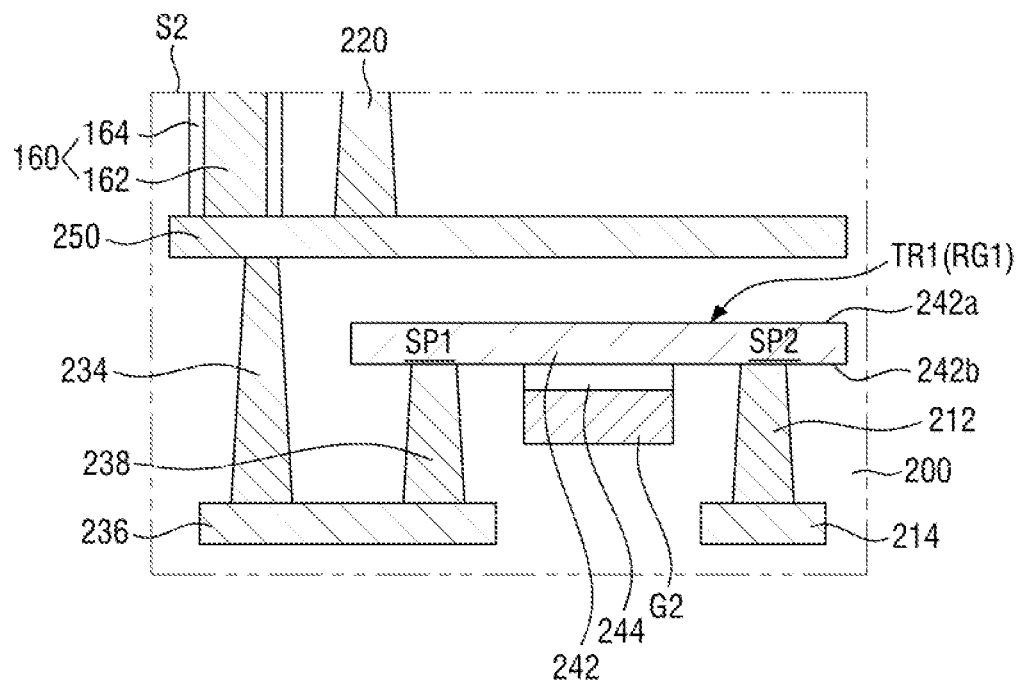

Referring to FIGS. 9 and 10D, in an image sensor 5 according to another alternative embodiment, a first gate electrode G1 and a first photoelectric conversion layer 320 may be connected to a fourth surface 242b of a first semiconductor layer 242. For example, a first light blocking layer 250 connected to the first gate electrode G1 and the first photoelectric conversion layer 320 may be connected to the fourth surface 242b of the first semiconductor layer 242. For example, a fourth via 234, a second conductive wiring 236, and a fifth via 238 may be formed in a first interlayer insulating film 200 to connect a bottom surface of the first light blocking layer 250 and the fourth surface 242b of the first semiconductor layer 242. The first light blocking layer 250 may cover the entire third surface 242a of the first semiconductor layer 242. The first light blocking layer 250 may be connected to a first part SP1 of the first semiconductor layer 242. In some embodiments, an eighth via 212 and a fifth conductive wiring 214 connected to a second part SP2 of the first semiconductor layer 242 may be formed. The eighth via 212 and the fifth conductive wiring 214 may be connected to the fourth surface 242b of the first semiconductor layer 242. The eighth via 212 and the fifth conductive wiring 214 may provide a predetermined electric potential (e.g., a second power supply voltage $V_{DD}2$) to the second part SP2 of the first semiconductor layer 242.

Figure 10E:
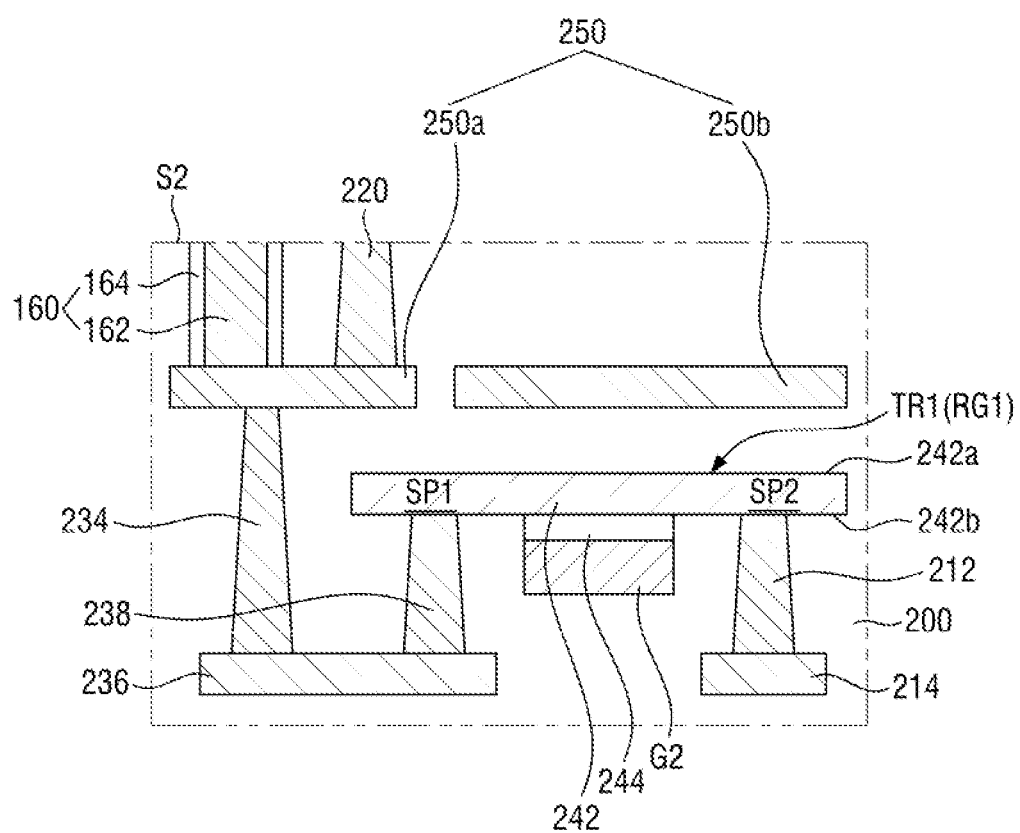

Referring to FIGS. 9 and 10E, in an image sensor 5 according to yet another alternative embodiment, a first light blocking layer 250 may include a first sub-blocking layer 250a and a second sub-blocking layer 250b spaced apart from each other. The first sub-blocking layer 250a may cover a part of a third surface 242a of a first semiconductor layer 242, and the second sub-blocking layer 250b may cover another part of the third surface 242a of the first semiconductor layer 242. The first sub-blocking layer 250a may be connected to a first gate electrode G1 and a first photoelectric conversion layer 320. The first sub-blocking layer 250a may be connected to a first part SP1 of the first semiconductor layer 242.

Figure 11:
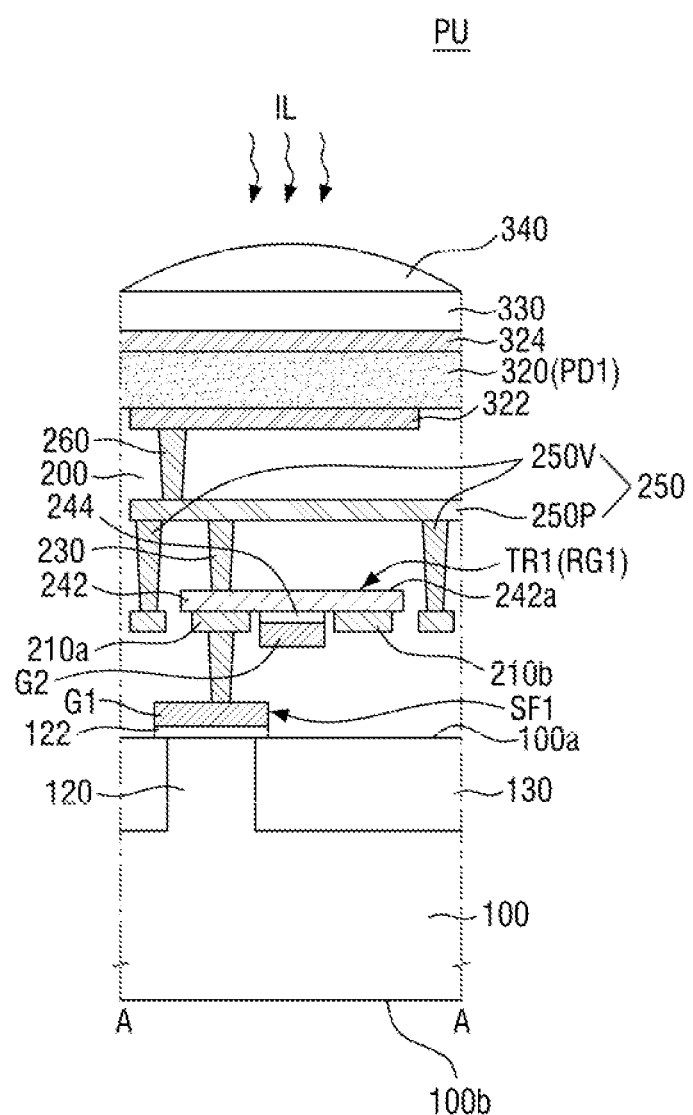
FIG. 11 is a cross-sectional view of an image sensor according to an embodiment.
Figure 12:
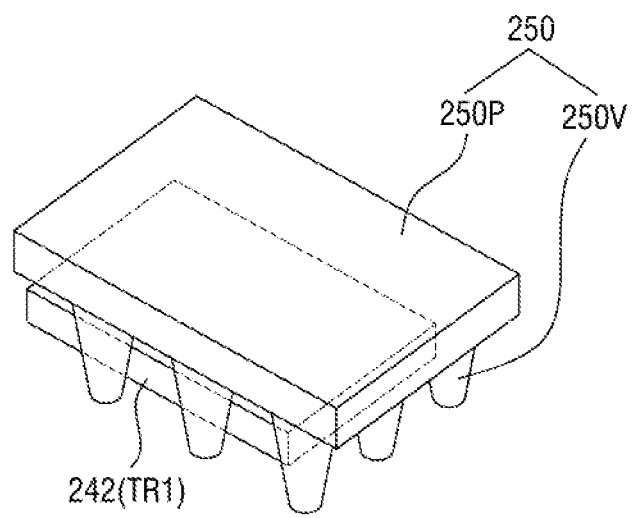
FIGS. 12 and 13 are partial perspective views of structures representing different respective examples of a first light blocking layer 250 of FIG. 11.
Figure 13:
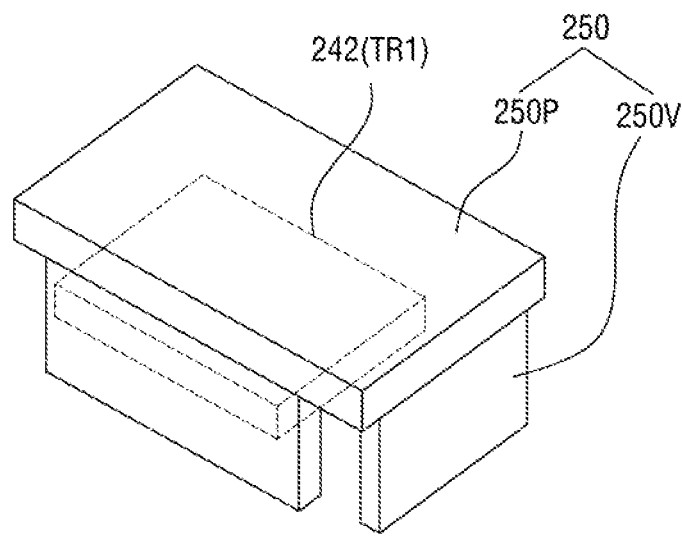

FIG. 11 is a cross-sectional view of a pixel unit region PU within the image sensor 5 according to another embodiment. FIGS. 12 and 13 are partial perspective views of structures representing different respective examples of a first light blocking layer 250 of FIG. 11. For ease of description, a description of elements and features described above in connection with FIGS. 1 through 7 will be given briefly or omitted.

Referring to FIGS. 11 through 13, in the image sensor according to the embodiments, the first light blocking layer 250 may include an upper surface part 250P and a side part 250V. The upper surface part 250P may cover at least a part of a third surface 242a of a first semiconductor layer 242. The side part 250V may cover side surfaces of the first semiconductor layer 242. For example, the side part 250V may extend from the upper surface part 250P toward the first semiconductor layer 242. The first upper surface 250P of the first light blocking layer 250 may cover the entire third surface 242a of the first semiconductor layer 242. As illustrated in FIG. 12, the side part 250V of the first light blocking layer 250 may include a plurality of vias surrounding the side surfaces of the first semiconductor layer 242. As illustrated in FIG. 13, the side part 250V of the first light blocking layer 250 may completely cover the side surfaces of the first semiconductor layer 242.

Figure 14:
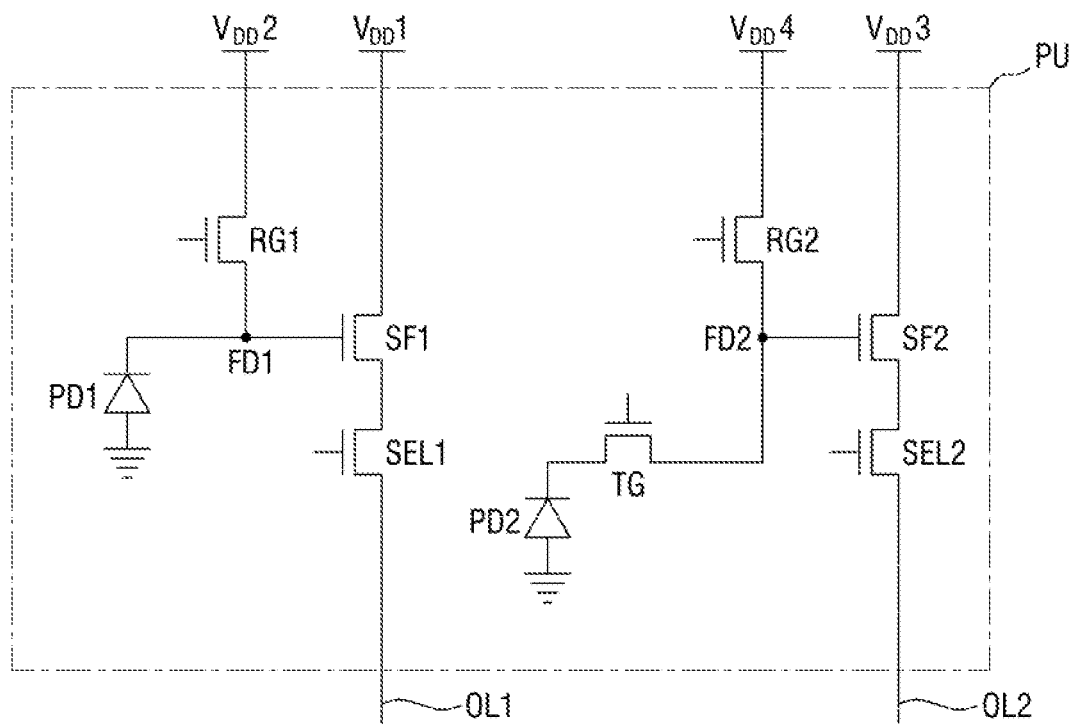
FIG. 14 is an example circuit diagram of a unit pixel region PU of an image sensor according to an embodiment.
Figure 15:
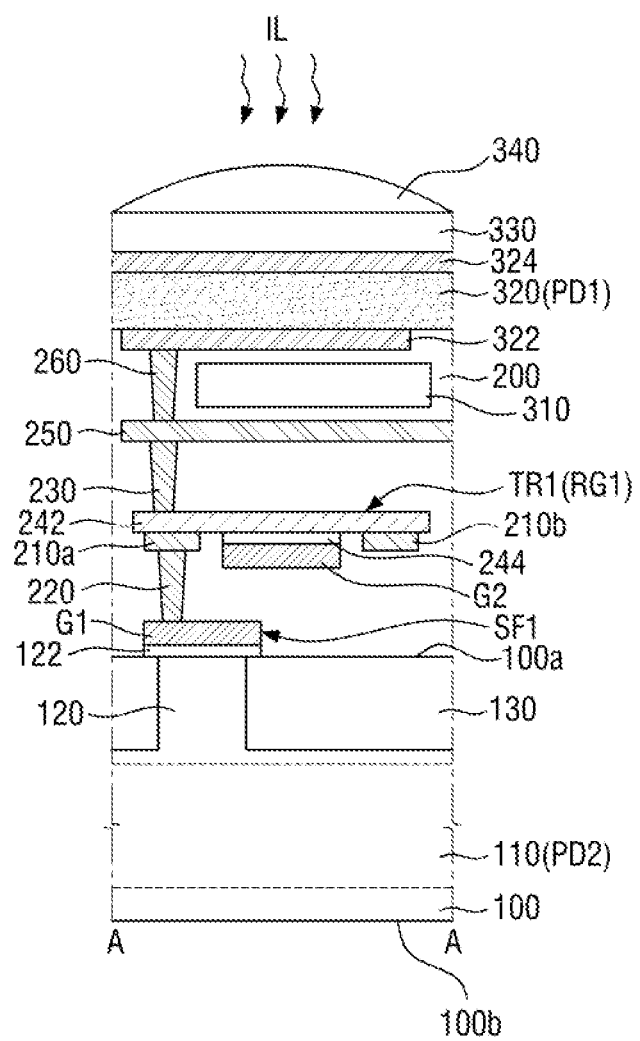
FIGS. 15 and 16 are cross-sectional views of respective image sensors according to an embodiment.
Figure 16:
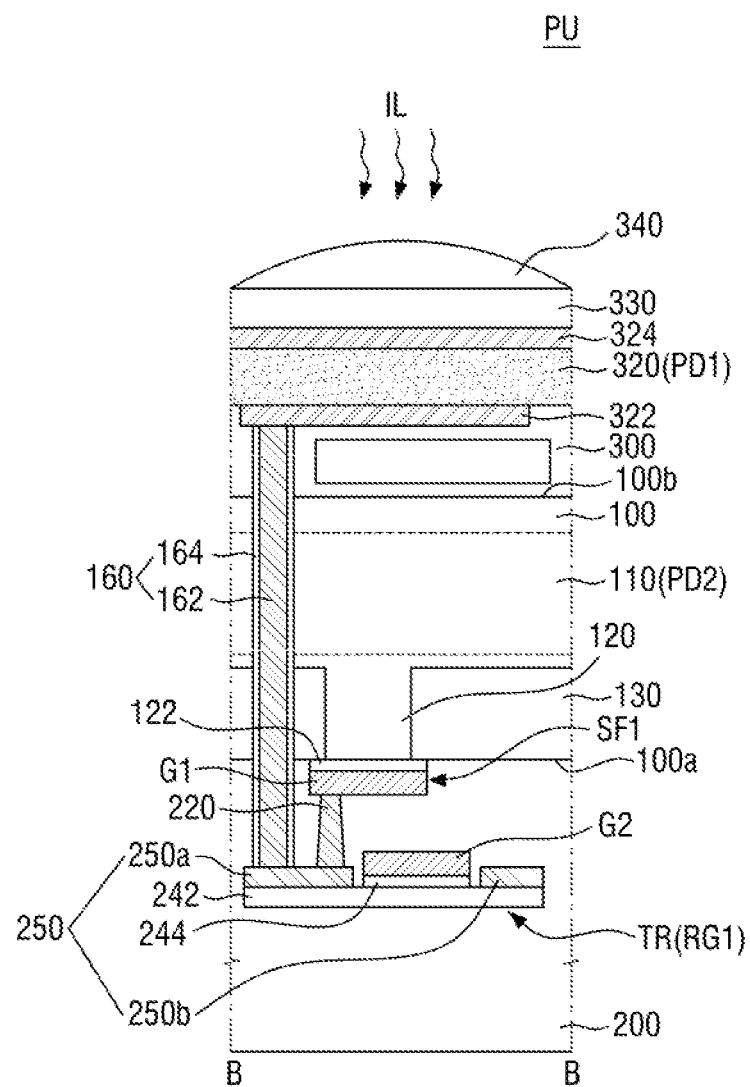

FIG. 14 is an example circuit diagram of a unit pixel region PU of the image sensor 5 according to another embodiment. FIGS. 15 and 16 are cross-sectional views of different examples of pixel unit regions PU in the image sensor 5 employing the circuit arrangement of FIG. 14. For ease of description, a description of elements and features described above using FIGS. 1 through 13 will be given briefly or omitted.

Referring to FIG. 14, the unit pixel region PU of the image sensor according to the embodiments may further include a second photoelectric converter PD2, a first transfer transistor TG, a second floating diffusion region FD2, a second reset transistor RG2, a second source follower transistor SF2, and a second selection transistor SEL2.

The second photoelectric converter PD2 may absorb light and accumulate charges corresponding to the amount of light. The second photoelectric converter PD2 may be, for example, a photodiode, a phototransistor, a photogate, a pinned photodiode, an organic photodiode, quantum dots, or a combination of the same.

The second photoelectric converter PD2 may be coupled to the first transfer transistor TG which transfers accumulated charges to the second floating diffusion region FD2. The first transfer transistor TG may transfer charges generated by the second photoelectric converter PD2 to the second floating diffusion region FD2. The first transfer transistor TG may be driven by a transfer line which applies a predetermined bias. When the first transfer transistor TG is turned on, charges generated by the second photoelectric converter PD2 may be transferred to the second floating diffusion region FD2.

The second source follower transistor SF2 may amplify a change in an electric potential of the second floating diffusion region FD2 and output the amplified change to a second output line OL2. For example, a predetermined electric potential (e.g., a third power supply voltage $V_{DD}3$) provided to a drain of the second source follower transistor SF2 may be provided to the second output line OL2 under the control of the second floating diffusion region FD2.

The second selection transistor SEL2 may select unit pixel regions to be read on a row-by-row basis. When the second selection transistor SEL2 is turned on, a predetermined electric potential (e.g., an electric potential provided from a source of the second source follower transistor SF2) provided to a drain of the second selection transistor SEL2 may be output to the second output line OL2.

The second reset transistor RG2 may periodically reset the second floating diffusion region FD2. When the second reset transistor RG2 is turned on, a predetermined electric potential (e.g., a fourth power supply voltage $V_{DD}4$) provided to a drain of the second reset transistor RG2 may be transferred to the second floating diffusion region FD2.

Referring to FIGS. 14 and 15, an image sensor according to embodiments may further include a second photoelectric conversion layer 110.

The second photoelectric conversion layer 110 may generate second photocharges in proportion to the amount of incident light IL incident from the outside. For example, the second photoelectric conversion layer 110 may correspond to the second photoelectric converter PD2 of FIG. 14.

In some embodiments, the second photoelectric conversion layer 110 may be formed in a substrate 100. For example, the second photoelectric conversion layer 110 may be formed by doping the substrate 100 with impurities. In addition, there may be a difference in impurity concentration between an upper part and a lower part of the second photoelectric conversion layer 110 so that the second photoelectric conversion layer 110 can have a potential slope. For example, the second photoelectric conversion layer 110 may be formed in a structure in which a plurality of impurity regions are stacked.

For ease of description, various transistors connected to the second photoelectric conversion layer 110 to process an electrical signal are not illustrated. However, some regions of the substrate 100 may be utilized to place the various transistors for processing an electrical signal generated by the second photoelectric conversion layer 110. For example, a second transfer transistor TG (see FIG. 14), a second reset transistor RG2 (see FIG. 14), a second source follower transistor SF2 (see FIG. 14), and a second selection transistor SEL2 (see FIG. 14) may be formed on a first surface 100a of the substrate 100.

In some embodiments, the second photoelectric conversion layer 110 may include a semiconductor photoelectric conversion layer.

In some embodiments, a color filter 310 may be formed in a first interlayer insulating film 200. The color filter 310 may include one of, for example, a red filter and a blue filter. However, this is merely an example, and the color filter 310 may also include one of a green filter, a yellow filter, a magenta filter, a cyan filter, and a white filter.

In some embodiments, the second photoelectric conversion layer 110 may detect light having a different wavelength from light detected by a first photoelectric conversion layer 320.

For example, the first photoelectric conversion layer 320 may detect green light, and the second photoelectric conversion layer 110 may detect red or blue light. Specifically, of the incident light IL, light having a green wavelength may be absorbed by the first wavelength conversion layer 320. Accordingly, the first photoelectric conversion layer 320 may provide an electrical signal for the green light. Light having wavelengths other than the green light may pass through the first photoelectric conversion layer 320. The light passing through the first photoelectric conversion layer 320 may pass through the color filter 310. As a result, red light or blue light may be provided to the second photoelectric conversion layer 110. Accordingly, the second photoelectric conversion layer 110 may provide an electrical signal for the red light or the blue light.

Referring to FIGS. 14 and 16, in an image sensor according to embodiments, incident light IL may be incident on a second surface 100b of a substrate 100. A color filter 310 may be formed in a second interlayer insulating film 300.

Figure 17:
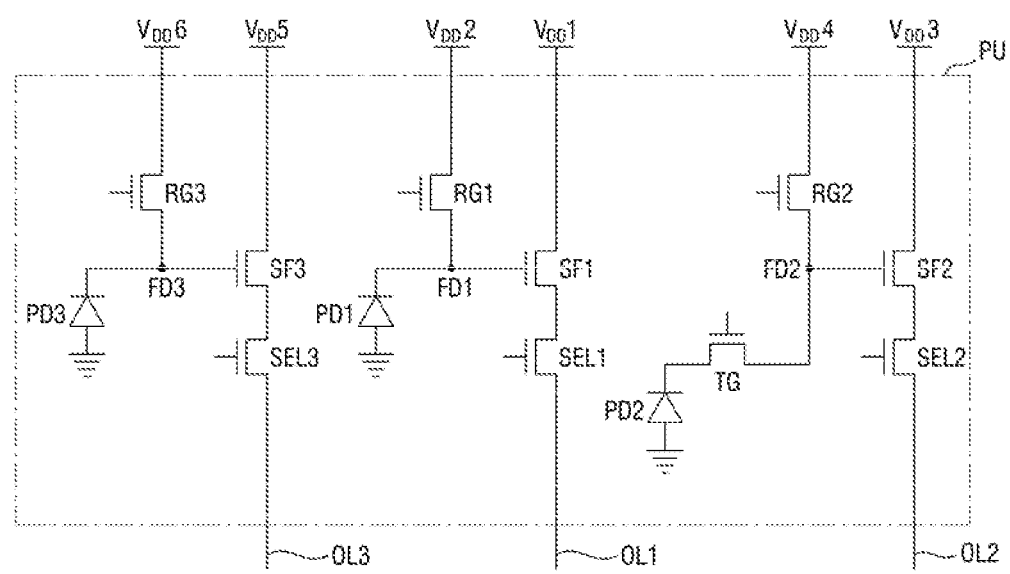
FIG. 17 is an example circuit diagram of a unit pixel region PU of an image sensor according to an embodiment.
Figure 18:
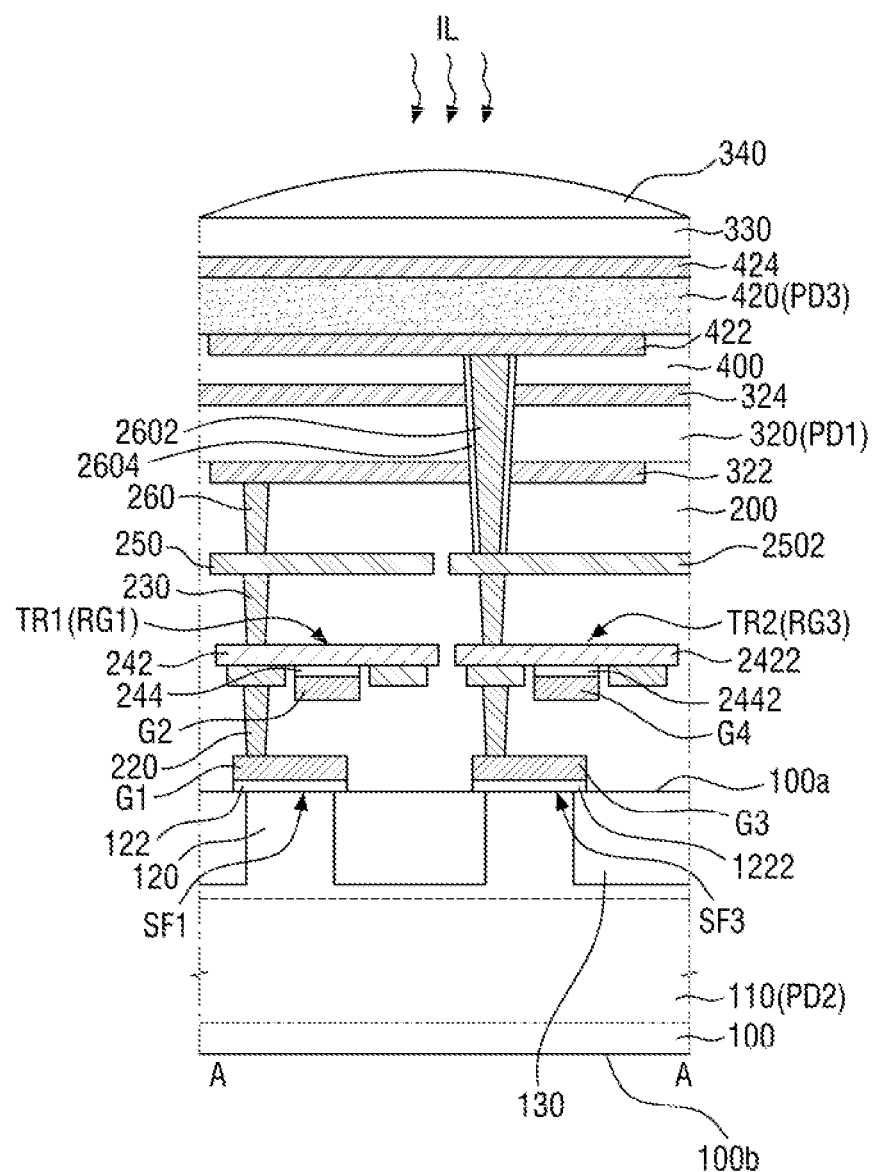
FIGS. 18 and 19 are cross-sectional views of respective image sensors according to various embodiments.
Figure 19:
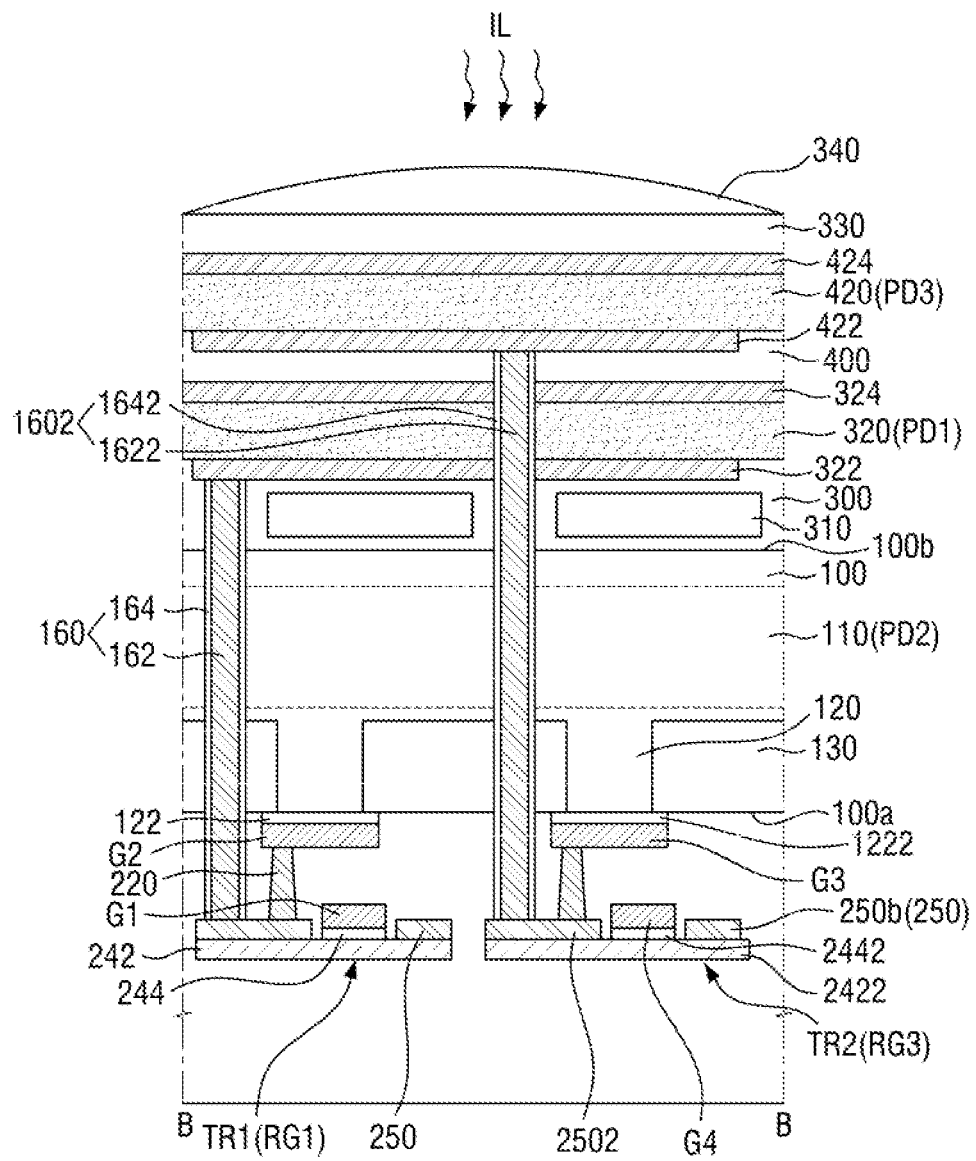

FIG. 17 is an example circuit diagram of a unit pixel region PU of the image sensor 5 according to an alternative embodiment. FIGS. 18 and 19 are cross-sectional views of example pixel unit regions PU in an image sensor employing the circuit diagram of FIG. 17. For ease of description, a description of elements and features described above in connection with FIGS. 1 through 16 will be given briefly or omitted.

Referring to FIG. 17, the unit pixel region PU of the image sensor according to the embodiments may further include a third photoelectric converter PD3, a third floating diffusion region FD3, a third reset transistor RG3, a third source follower transistor SF3, and a third selection transistor SEL3.

The third photoelectric converter PD3 may absorb light and accumulate charges corresponding to the amount of light. The third photoelectric converter PD3 may be, for example, a photodiode, a phototransistor, a photogate, a pinned photodiode, an organic photodiode, quantum dots, or a combination of the same.

The charges accumulated in the third photoelectric converter PD3 may be stored in the third floating diffusion region FD3.

The third source follower transistor SF3 may amplify a change in an electric potential of the third floating diffusion region FD3 and output the amplified change to a third output line OL3. For example, a predetermined electric potential (e.g., a fifth power supply voltage $V_{DD}5$) provided to a drain of the third source follower transistor SF3 may be provided to the third output line OL3 under the control of the third floating diffusion region FD3.

The third selection transistor SEL3 may select unit pixel regions to be read on a row-by-row basis. When the third selection transistor SEL3 is turned on, a predetermined electric potential (e.g., an electric potential provided from a source of the third source follower transistor SF3) provided to a drain of the third selection transistor SEL3 may be output to the third output line OL3.

The third reset transistor RG3 may periodically reset the third floating diffusion region FD3. When the third reset transistor RG3 is turned on, a predetermined electric potential (e.g, a sixth power supply voltage $V_{DD}6$) provided to a drain of the third reset transistor RG3 may be transferred to the third floating diffusion region FD3.

Referring to FIGS. 17 and 18, an image sensor according to embodiments may further include a third photoelectric conversion layer 420, a third gate electrode G3, a second transistor structure TR2, and a second light blocking layer 2502. The third photoelectric conversion layer 420 may generate third photocharges in proportion to the amount of incident light IL incident from the outside. For example, the third photoelectric conversion layer 420 may correspond to the third photoelectric converter PD3 of FIG. 17.

The third photoelectric conversion layer 420 may be formed outside a substrate 100. For example, the third photoelectric conversion layer 420 may be formed on a third interlayer insulating film 400 on a second photoelectric conversion layer 110. The third photoelectric conversion layer 420 may be formed on a first surface 100a of the substrate 100 and may be spaced apart from the substrate 100 by a first interlayer insulating film 200 and the third interlayer insulating film 400.

A second lower electrode 422 and a second upper electrode 424 may be formed adjacent to the third photoelectric conversion layer 420. The third photoelectric conversion layer 420 may be interposed between the second lower electrode 422 and the second upper electrode 424.

Different levels of voltages may be applied to the second lower electrode 422 and the second upper electrode 424, respectively. For example, different levels of voltages may be applied to the second lower electrode 422 and the second upper electrode 424 so that an electrical signal generated by the third photoelectric conversion layer 420 is directed to the second lower electrode 422.

The second lower electrode 422 and the second upper electrode 424 may include a transparent conductive material. The third photoelectric conversion layer 420 may include an organic photoelectric conversion layer.

The third gate electrode G3 may be formed on the first surface 100a of the substrate 100. In some embodiments, the third gate electrode G3 may form a third source follower transistor SF3. For example, the third source follower transistor SF3 may include a third gate dielectric layer 1222 and the third gate electrode G3 which are formed on an active region 120.

The second transistor structure TR2 may be formed on the first surface 100a of the substrate 100. For example, the second transistor structure TR2 may be formed in the first interlayer insulating film 200.

The second transistor structure TR2 may include a second semiconductor layer 2422, a fourth gate dielectric layer 2442, and a fourth gate electrode G4. The second transistor structure TR2 may be similar to a first transistor structure TR1, and thus a detailed description thereof will be omitted.

The second semiconductor layer 2422 may form a third floating diffusion region FD3. For example, an end of the second semiconductor layer 2422 may be connected to the third gate electrode G3 and the third photoelectric conversion layer 420.

A second through via 2602 may penetrate a first photoelectric conversion layer 320 and may be connected to a first semiconductor layer 242. The third photoelectric conversion layer 420 may be connected to the first semiconductor layer 242 through the second through via 2602. The second through via 2602 may be electrically insulated from the first photoelectric conversion layer 320, a first lower electrode 322 and a first upper electrode 324 by second spacers 2604.

The second transistor structure TR2 including the second semiconductor layer 2422 may form a third reset transistor RG3.

The second light blocking layer 2502 may cover at least a part of the second semiconductor layer 2422 to block it from the incident light IL. In some embodiments, the second through via 2602 may connect the second lower electrode 422 and the second light blocking layer 2502.

Referring to FIGS. 17 and 19, in an image sensor according to embodiments, incident light IL may be incident on a second surface 100b of a substrate 100.

A third through via 1602 may penetrate the substrate 100 and a first photoelectric conversion layer 320 and may be connected to a second semiconductor layer 2422. A third photoelectric conversion layer 420 may be connected to the second semiconductor layer 2422 through the third through via 1602. The third through via 1602 may include a third plug pattern 1622 including a conductive material and third spacers 1642 including an insulating material. The third plug pattern 1622 may be electrically insulated from the substrate 100, the first photoelectric conversion layer 320, a first lower electrode 322, and a first upper electrode 324 by the third spacers 1642.

In some embodiments, a second light blocking layer 2502 may contact the second semiconductor layer 2422.

Figure 20:
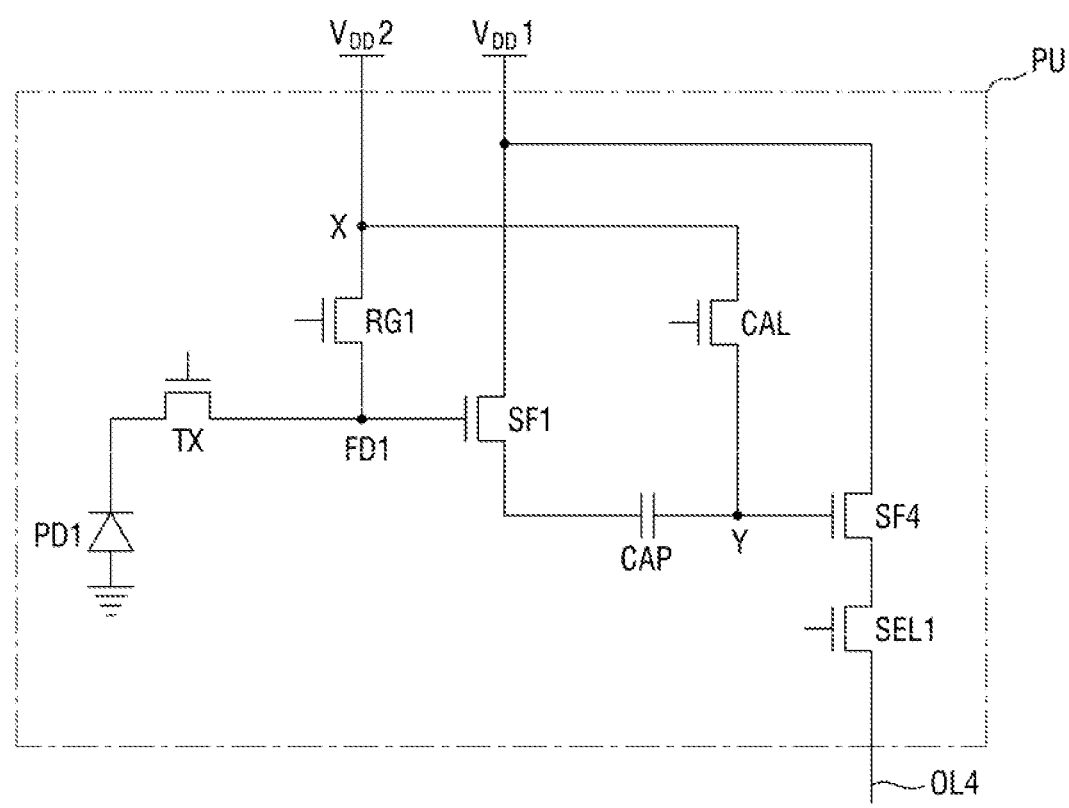
FIG. 20 is an example circuit diagram of a unit pixel region PU of an image sensor according to an embodiment.
Figure 21:
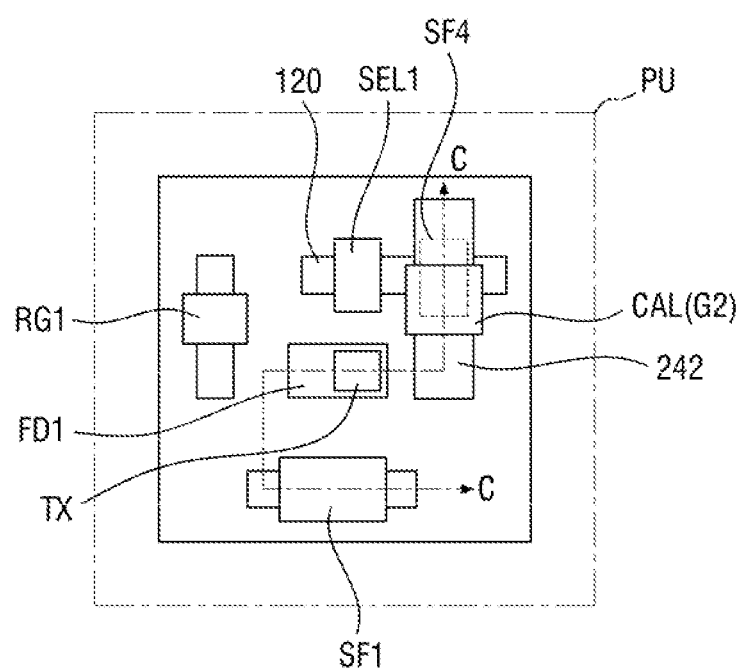
FIG. 21 is a schematic layout view of the unit pixel region PU of the image sensor according to an embodiment.
Figure 22:
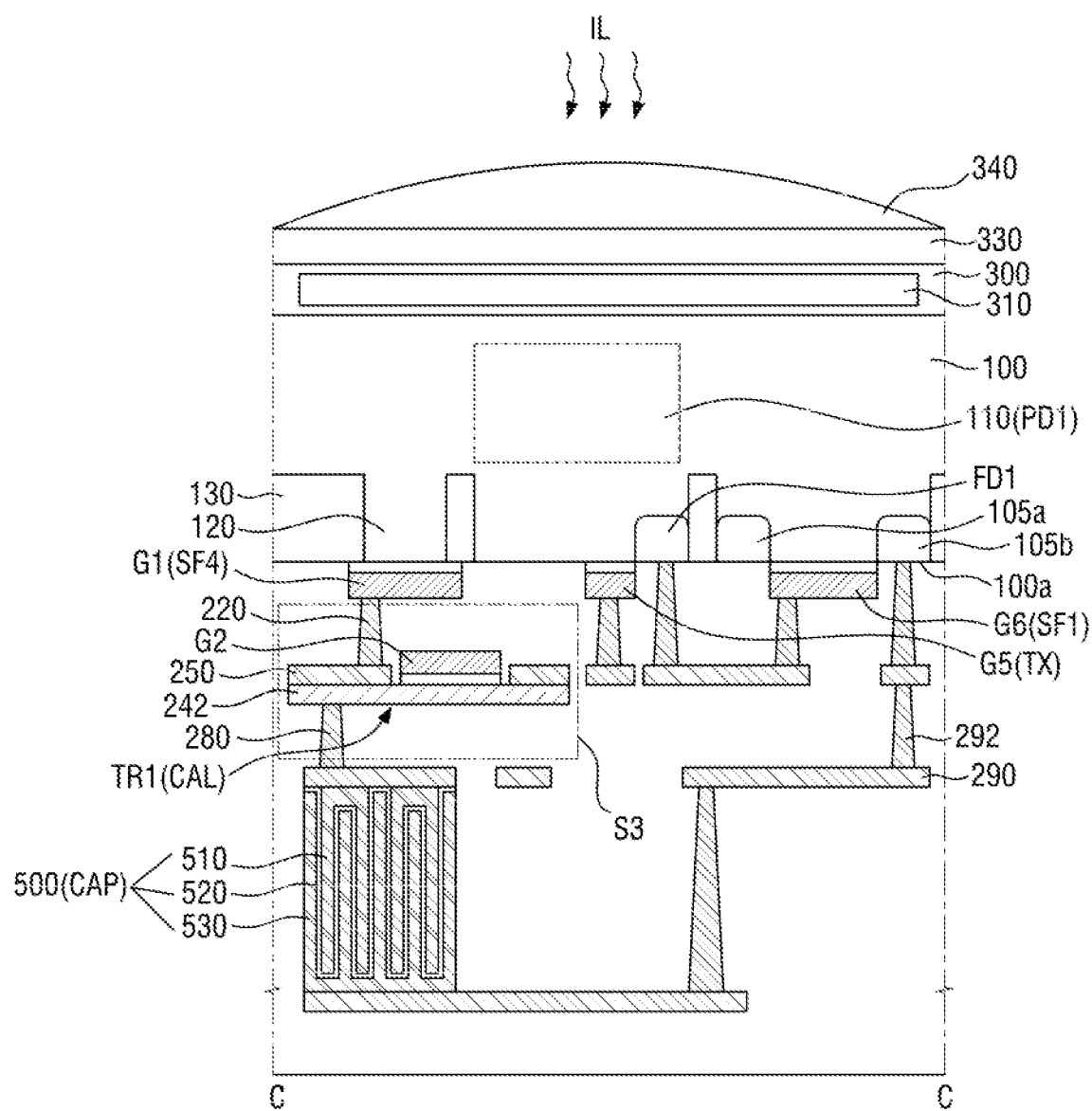
FIG. 22 is a cross-sectional view taken along line C-C of FIG. 21.

FIG. 20 is an example circuit diagram of a unit pixel region PU of an image sensor 5 according to yet another embodiment. FIG. 21 is a schematic layout view of the unit pixel region PU of the image sensor according to the embodiments. FIG. 22 is a cross-sectional view taken along line C-C of FIG. 21. FIGS. 23A through 23E are various enlarged views of region S3 of FIG. 22. For ease of description, a description of elements and features described above in connection with FIGS. 1 through 7 will be given briefly or omitted.

Referring to FIG. 20, the unit pixel region PU in this embodiment may further include a second transfer transistor TX, a storage device CAP, a control transistor CAL, and a fourth source follower transistor SF4.

A first photoelectric converter PD1 may be coupled to the second transfer transistor TX which transfers accumulated charges to a first floating diffusion region FD1. The second transfer transistor TX may transfer charges generated by the first photoelectric converter PD1 to the first floating diffusion region FD1. The second transfer transistor TX may be driven by a transfer line which applies a predetermined bias. When the second transfer transistor TX is tuned on, charges generated by the first photoelectric converter PD1 may be transferred to the first floating diffusion region FD1.

A first source follower transistor SF1 may amplify a change in an electric potential of the first floating diffusion region FD1 and provide the amplified change to the storage device CAP. For example, a predetermined electric potential (e.g., a first power supply voltage $V_{DD}1$) provided to a drain of the first source follower transistor SF1 may be provided to a side of the storage device CAP under the control of the first floating diffusion region FD1.

The control transistor CAL may control an electric potential of a first node Y. The control transistor CAL may be driven by a control line which applies a predetermined bias.

For example, when the control transistor CAL is turned on, a predetermined electric potential (e.g., a second power supply voltage $V_{DD}2$ provided from a second node X) provided to a drain of the control transistor CAL may be transferred to the first node Y.

The storage device CAP may be interposed between a source of the first source follower transistor SF1 and the first node Y and store an electrical signal provided by the first source follower transistor SF1. Some examples of the storage device CAP are a high-capacity capacitor (a supercapacitor or an ultracapacitor) such as an electric double layer capacitor (EDLC) or a metal-insulator-metal (MIM) capacitor.

The fourth source follower transistor SF4 may serve as a source follower buffer amplifier controlled by the first node Y. The fourth source follower transistor SF4 may amplify a change in an electric potential of the first node Y and output the amplified change to a fourth output line OL4. For example, a predetermined electric potential (e.g., the first power supply voltage $V_{DD}1$) provided to the drain of the first source follower transistor SF1 may be provided to the fourth output line OL4 under the control of the first floating diffusion region FD1.

Referring to FIGS. 20 through 23A, the image sensor 5 in according to the embodiments may include a fifth gate electrode G5, a first source/drain region FD1 (e.g., the first floating diffusion region FD1 of FIG. 20), a sixth gate electrode G6, a second source/drain region 105a, a third source/drain region 105b, and a capacitor structure 500.

The fifth gate electrode G5 may be formed on a first surface 100a of a substrate 100. In some embodiments, the fifth gate electrode G5 may form the second transfer transistor TX.

The first source/drain region FD1 may be formed in an active region 120 disposed on a side of the fifth gate electrode G5. For example, the first source/drain region FD1 may be formed by doping the active region 120 with impurities. In some embodiments, the first source/drain region FD1 may form the first floating diffusion region FD1 of FIG. 20. Accordingly, the second transfer transistor TX may transfer first photocharges generated by a second photoelectric conversion layer 110 to the first source/drain region FD1 (or the first floating diffusion region FD1 of FIG. 20).

In some embodiments, the second photoelectric conversion layer 110 may correspond to the first photoelectric converter PD1 of FIG. 20.

The sixth gate electrode G6 may be formed on the first surface 100a of the substrate 100. In some embodiments, the sixth gate electrode G6 may form the first source follower transistor SF1. For example, the first source/drain region FD1 may be connected to the sixth gate electrode G6.

The second source/drain region 105a and the third source/drain region 105b may be formed in the active region 120 disposed on both sides of the sixth gate electrode G6. For example, the second source/drain region 105a and the third source/drain region 105b may be formed by doping the active region 120 with impurities.

A predetermined electric potential (e.g., the first power supply voltage $V_{DD}1$) may be provided to the second source/drain region 105a. Accordingly, the first source/follower transistor SF1 may amplify a change in an electric potential of the first source/drain region FD1 and provide the amplified change to the third source/drain region 105b.

The capacitor structure 500 may be connected to a first gate electrode G1, a first semiconductor layer 242, and the third source/drain region 105b. For example, the capacitor structure 500 may include a first capacitor electrode 510, a second capacitor electrode 530, and a capacitor dielectric layer 520.

The first capacitor electrode 510 may be connected to a first part SP1 of the first semiconductor layer 242 by a ninth via 280 formed in a first interlayer insulating film 200. The first part SP1 of the first semiconductor layer 242 may be connected to the first gate electrode G1 by a first via 220.

In some embodiments, the first gate electrode G1 may form the fourth source follower transistor SF4. In addition, in some embodiments, a first transistor structure TR1 may form the control transistor CAL. That is, the first part SP1 of the first semiconductor layer 242 may correspond to the first node Y of FIG. 20.

The second capacitor electrode 530 may be connected to the third source/drain region 105b by a sixth conductive wiring 290 and a tenth via 292 formed in the first interlayer insulating film 200.

The capacitor dielectric layer 520 may be interposed between the first capacitor electrode 510 and the second capacitor electrode 530. In some embodiments, the capacitor structure 500 may form the storage device CAP. For example, the capacitor structure 500 may store charges in the capacitor dielectric layer 520 using a potential difference between the first capacitor electrode 510 and the second capacitor electrode 530. Accordingly, the capacitor structure 500 may store an electrical signal provided by the sixth gate electrode G6.

Figure 23A:
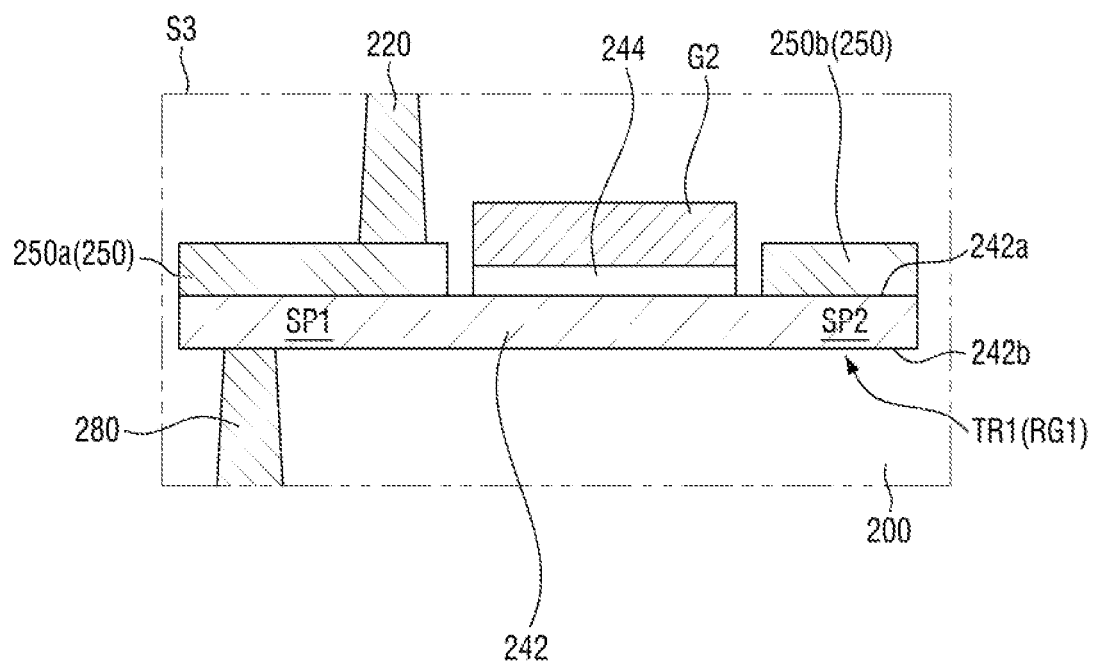
FIGS. 23A, 23B, 23C, 23D and 23E are respective enlarged views of region S3 of FIG. 22.

Referring to FIGS. 22 and 23A, in the image sensor according to the embodiments, the first gate electrode G1 may be connected to a third surface 242a of the first semiconductor layer 242, and the first capacitor electrode 510 may be connected to a fourth surface 242b of the first semiconductor layer 242.

Figure 23B:
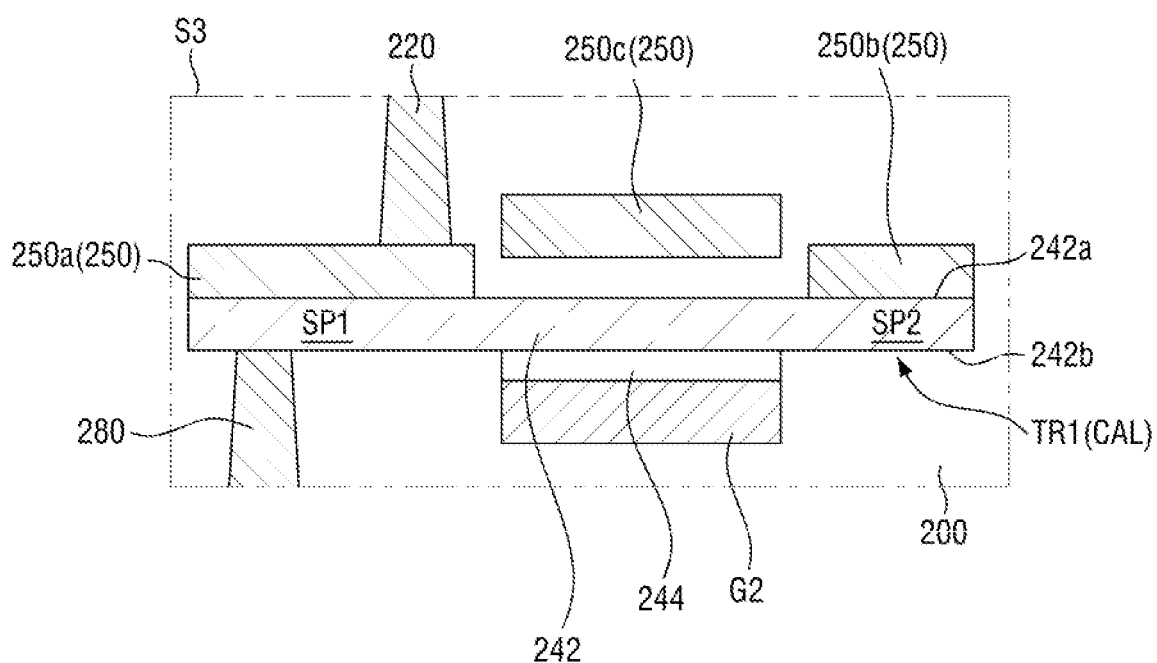

Referring to FIGS. 22 and 23B, in an image sensor according to embodiments, a second gate electrode G2 and a second gate dielectric layer 244 may be formed on a fourth surface 242b of a first semiconductor layer 242.

Figure 23C:
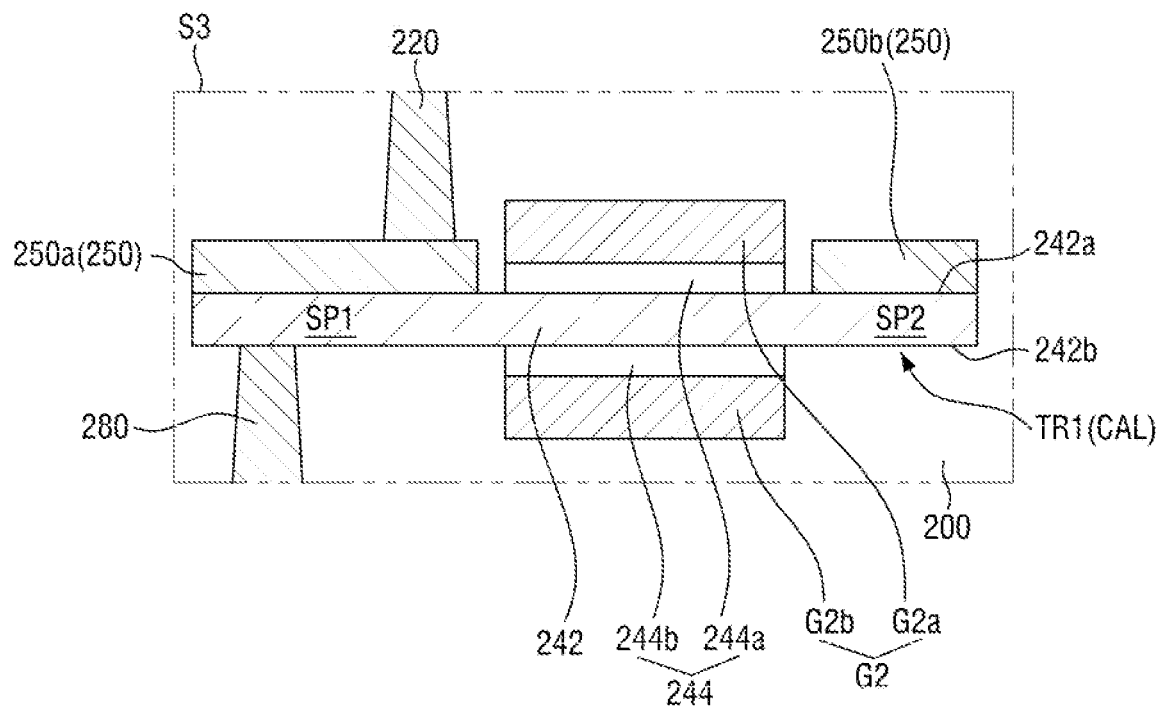

Referring to FIGS. 22 and 23C, in an image sensor according to embodiments, a second gate electrode G2 and a second gate dielectric layer 244 may be formed on both a third surface 242a and a fourth surface 242b of a first semiconductor layer 242.

Figure 23D:
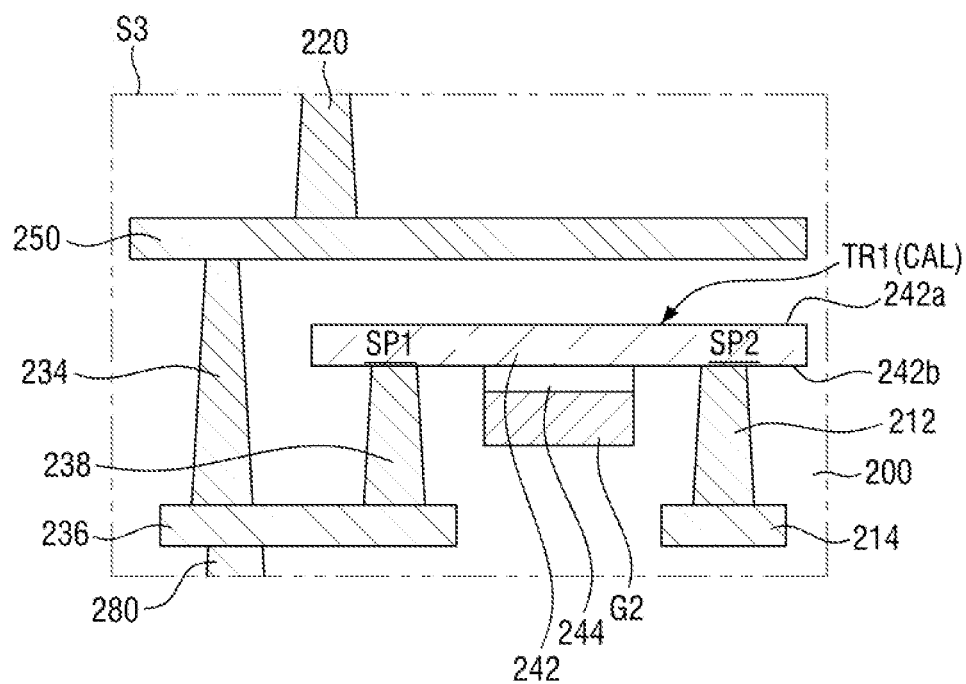

Referring to FIGS. 22 and 23D, in an image sensor according to embodiments, a second gate electrode G2 and a second gate dielectric layer 244 may be connected to a fourth surface 242b of a first semiconductor layer 242.

Figure 23E:
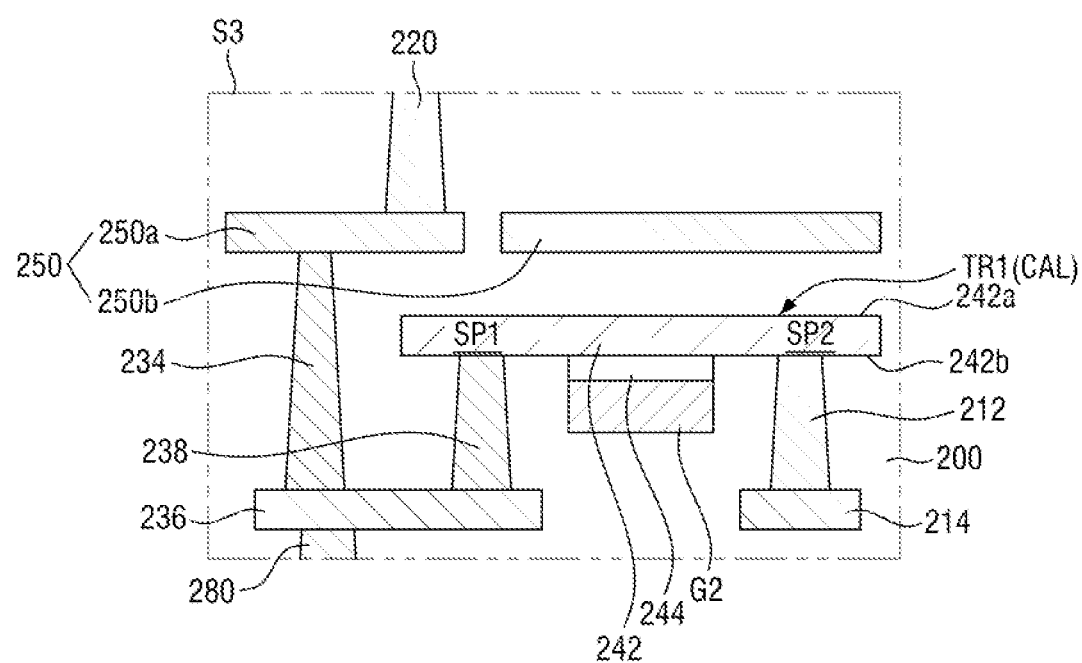

Referring to FIGS. 22 and 23E, in an image sensor according to embodiments, a first light blocking layer 250 may include a first sub-blocking layer 250a and a second sub-blocking layer 250b spaced apart from each other.

In concluding the detailed description, those skilled in the art will appreciate that many variations and modifications may be made to the disclosed embodiments without departing from the principles of the present inventive concept. Therefore, the disclosed embodiments of the inventive concept are used in a generic and descriptive sense only and not for purposes of limitation.

What is claimed is:

1. An image sensor comprising:
a substrate which comprises a first surface and a second surface on opposite sides;
a first transistor having a first gate disposed on the first surface of the substrate;
a photoelectric conversion layer which is disposed in the substrate and generates photocharges from incident light;
a second transistor having a transistor structure which is disposed proximate to the first surface of the substrate and comprises a semiconductor layer comprising a metal oxide semiconductor material and a second gate disposed on a central region of the semiconductor layer;
a light blocking layer which is disposed proximate to the first surface of the substrate and covers at least a part of the semiconductor layer to block the semiconductor layer from the incident light; and
a capacitor structure,
wherein a first part of the semiconductor layer located at an end portion of the semiconductor layer is connected to the first gate and the capacitor structure.

2. The image sensor of claim 1, further comprising:
a first source/drain region which is disposed in the substrate and stores the photocharges generated by the photoelectric conversion layer; and
a first source follower transistor which is disposed on the first surface of the substrate and comprises a third gate connected to the first source/drain region and a second source/drain region disposed on a side of the third gate,
wherein the capacitor structure is connected to the second source/drain region.

3. The image sensor of claim 2, wherein the capacitor structure comprises a first capacitor electrode, a second capacitor electrode, and a capacitor dielectric layer interposed between the first capacitor electrode and the second capacitor electrode, wherein the first capacitor electrode is connected to the first part of the semiconductor layer and the first gate, and the second capacitor electrode is connected to the second source/drain region.

4. An image sensor comprising:
a substrate having a first surface and a second surface on opposite sides;
a source follower transistor having a first gate disposed on the first surface of the substrate;
a first photoelectric conversion layer, separate from the substrate, that generates first photocharges from incident light;
a transistor structure which is disposed proximate to the first surface of the substrate and comprises a semiconductor layer comprising a metal oxide semiconductor material and a second gate disposed on a central region of the semiconductor layer; and
a light blocking layer which is disposed between the first photoelectric conversion layer and the transistor structure, is spaced from the first photoelectric conversion layer, and covers at least a part of the semiconductor layer to block the semiconductor layer from the incident light,
wherein a first part of the semiconductor layer located on a side of the central region is connected to the first gate and the first photoelectric conversion layer.

5. The image sensor of claim 4, wherein the first part of the semiconductor layer is a floating diffusion region which stores the first photocharges generated by the first photoelectric conversion layer, and the transistor structure is structure of a reset transistor which periodically resets the floating diffusion region.

6. The image sensor of claim 4, wherein the first photoelectric conversion layer is disposed on the first surface of the substrate, and the transistor structure is interposed between the substrate and the first photoelectric conversion layer.

7. The image sensor of claim 4, further comprising a second photoelectric conversion layer which is disposed in the substrate and generates second photocharges from the incident light.

8. The image sensor of claim 7, wherein the first photoelectric conversion layer comprises an organic photoelectric conversion layer, and the second photoelectric conversion layer comprises a semiconductor photoelectric conversion layer.

9. The image sensor of claim 4, wherein the first photoelectric conversion layer is disposed on the second surface of the substrate.

10. The image sensor of claim 9, further comprising a through via which penetrates the substrate to connect the first photoelectric conversion layer and the first part of the semiconductor layer.

11. An image sensor comprising:
a substrate having a first surface and a second surface on opposite sides;
a first transistor having a first gate disposed on the first surface;
a photoelectric conversion layer which generates photocharges from light incident in a first direction;
a second transistor having a transistor structure disposed between the first surface and the photoelectric conversion layer and spaced from the photoelectric conversion layer, and comprises a semiconductor layer composed of a metal oxide semiconductor material, and having a third surface facing the first direction and a fourth surface opposite the third surface, with a second gate disposed on the semiconductor layer, the semiconductor layer being connected to the first gate; and
a light blocking layer disposed between the third surface and the photoelectric conversion layer, and spaced from the photoelectric conversion layer, wherein the light blocking layer comprises an upper surface part which covers at least a part of the third surface of the semiconductor layer and a side part which covers at least a part of each side surface of the semiconductor layer.

12. The image sensor of claim 11, wherein the light blocking layer comprises:
   a first sub-blocking layer which covers a part of the third surface of the semiconductor layer; and
   a second sub-blocking layer which is spaced apart from the first sub-blocking layer and covers another part of the third surface of the semiconductor layer.

13. The image sensor of claim 11, further comprising:
   a first via which connects a first part of the semiconductor layer disposed on a side of the second gate to the first gate; and
   a second via which is connected to the first part of the semiconductor layer.

14. The image sensor of claim 11, wherein the side part of the light blocking layer comprises a plurality of vias connected to the upper surface part of the light blocking layer.

15. The image sensor of claim 11, wherein the light blocking layer contacts the third surface of the semiconductor layer.

16. The image sensor of claim 1, wherein the second gate is disposed on the fourth surface of the semiconductor layer.

17. The image sensor of claim 11, wherein the semiconductor layer comprises indium gallium zinc oxide (IGZO).

18. The image sensor of claim 1, wherein the second gate is disposed on the third surface of the semiconductor layer.

19. The image sensor of claim 18, wherein the transistor structure further comprises a third gate disposed on the fourth surface of the semiconductor layer.

* * * * *